United States Patent
Yamaguchi et al.

(10) Patent No.: US 6,328,529 B1
(45) Date of Patent: Dec. 11, 2001

(54) COOLING DEVICE WITH SUPPORT MEMBERS FACING FIN

(75) Inventors: Hiroo Yamaguchi, Toyohashi; Takayuki Hayashi, Aichi-gun; Kazuaki Kafuku; Takai Okochi, both of Chiryu, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/472,086

(22) Filed: Dec. 23, 1999

(30) Foreign Application Priority Data

| Apr. 28, 1998 | (JP) | 11-122521 |
| Dec. 25, 1998 | (JP) | 10-369082 |
| Dec. 25, 1998 | (JP) | 10-369083 |
| Dec. 25, 1998 | (JP) | 10-369084 |
| Dec. 25, 1998 | (JP) | 10-369085 |
| Dec. 25, 1998 | (JP) | 10-369086 |
| Apr. 2, 1999 | (JP) | 11-096844 |
| Jul. 16, 1999 | (JP) | 11-203564 |

(51) Int. Cl.$^7$ .................................................. F04D 29/58
(52) U.S. Cl. .................. 415/178; 415/211.2; 415/213.1; 415/214.1; 415/228
(58) Field of Search ..................... 415/176, 177, 415/178, 200, 211.2, 213.1, 214.1, 228; 165/80.3, 185, 125; 361/697; 257/722

(56) References Cited

U.S. PATENT DOCUMENTS

| 5,494,098 | 2/1996 | Morosas . | |
| 5,518,071 | * 5/1996 | Lee | 165/185 |
| 5,615,084 | 3/1997 | Anderson et al. . | |
| 5,615,998 | 4/1997 | Kodama et al. . | |
| 5,625,229 | * 4/1997 | Kojima et al. | 257/712 |
| 5,701,951 | * 12/1997 | Jean | 165/121 |
| 5,706,169 | * 1/1998 | Yeh | 361/690 |
| 5,740,014 | 4/1998 | Lin . | |
| 6,109,340 | * 8/2000 | Nakase et al. | 165/80.3 |
| 6,135,200 | * 10/2000 | Okochi et al. | 165/121 |
| 6,166,904 | * 12/2000 | Kitahara et al. | 361/697 |

FOREIGN PATENT DOCUMENTS

| 0 706 212 A2 | 4/1996 | (EP) . |
| 0 809 287 A1 | 11/1997 | (EP) . |

OTHER PUBLICATIONS

Derwent Abstract Accession No. 87–005773/01, SU 1229982 A, May 7, 1986, Abstract.

* cited by examiner

Primary Examiner—Edward K. Look
Assistant Examiner—Ninh Nguyen
(74) Attorney, Agent, or Firm—Harness, Dickey & Pierce, PLC

(57) ABSTRACT

A blower for flowing cooling air toward a corrugated fin is disposed to face the corrugated fin. The blower is covered with a blower case. Leg portions are integrally formed with and protrude from the blower case to face the corrugated fin at both sides in a corrugated direction of the corrugated fin. The blower case is fixed to a radiation plate by elastic deformation of the leg portions. The leg portions cover the both sides in the corrugated direction of the corrugated fin, so that the corrugated fin is protected from external force.

46 Claims, 24 Drawing Sheets

FIG. 10
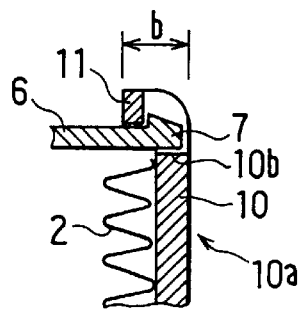
FIG. 11
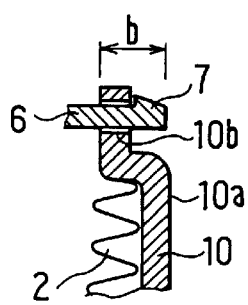
FIG. 12A
FIG. 12C
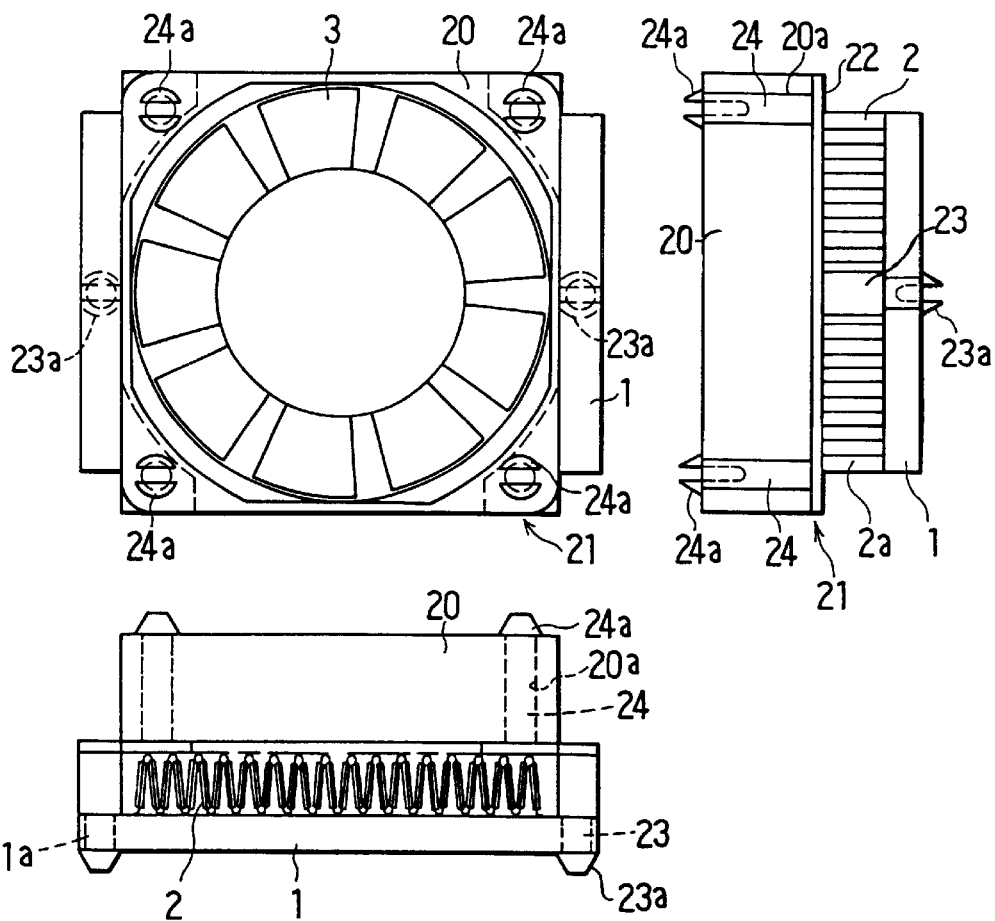
FIG. 12B

FIG.13A
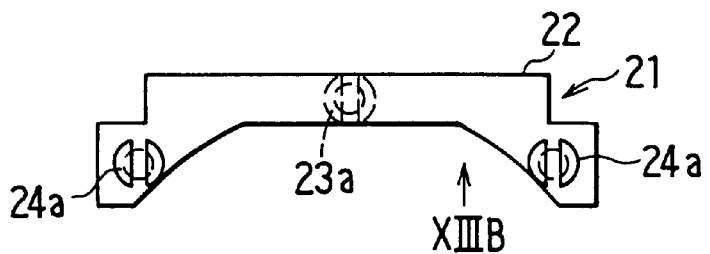
FIG.13B
FIG.13C
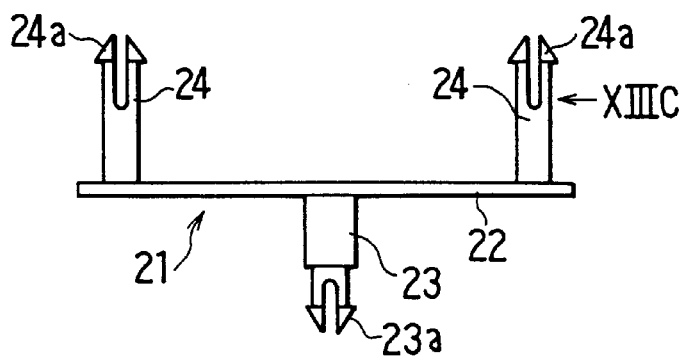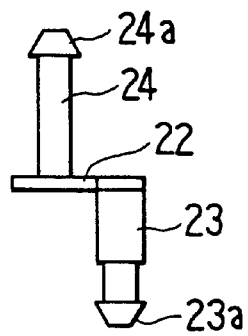
FIG.14
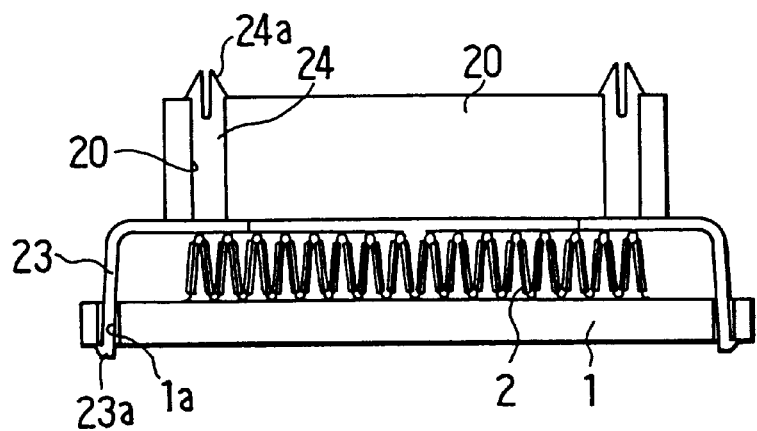

FIG. 15A
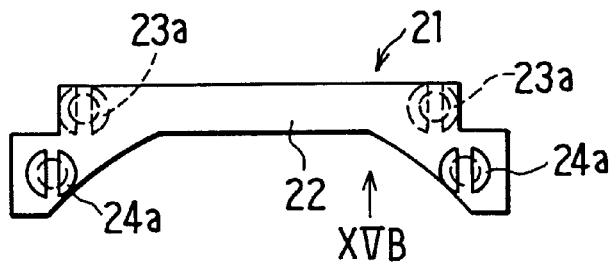
FIG. 15B
FIG. 15C
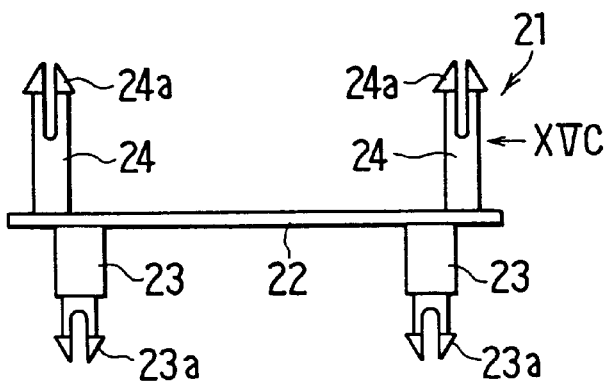 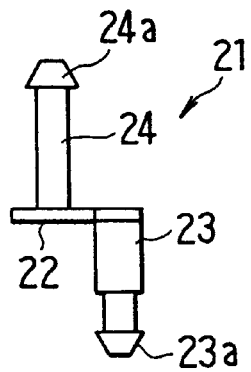
FIG. 16
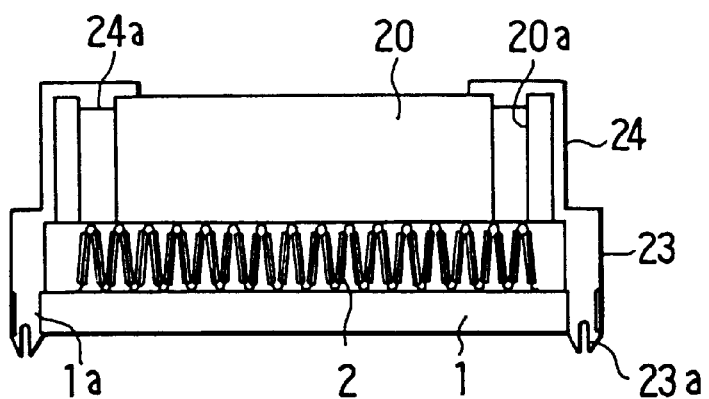

FIG. 53A
FIG. 53C
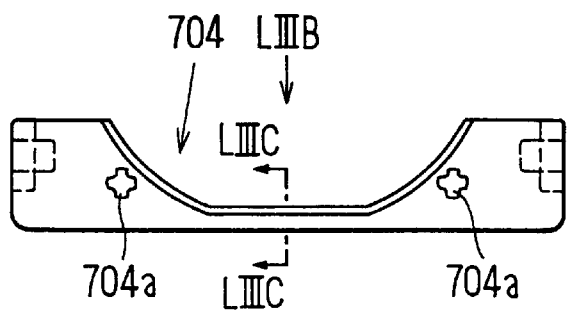
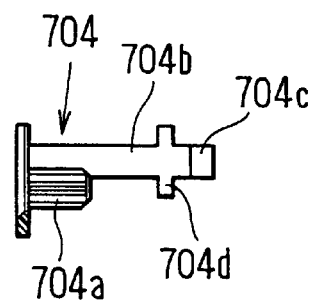
FIG. 53B
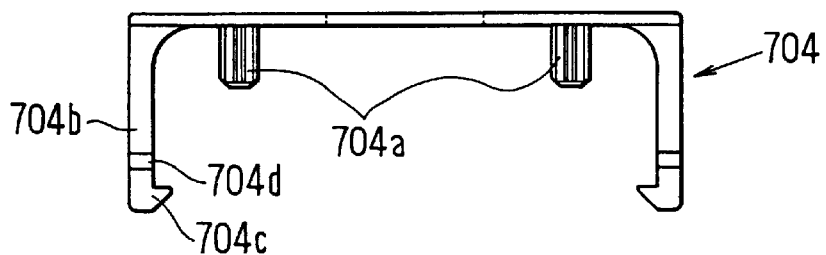
FIG. 54
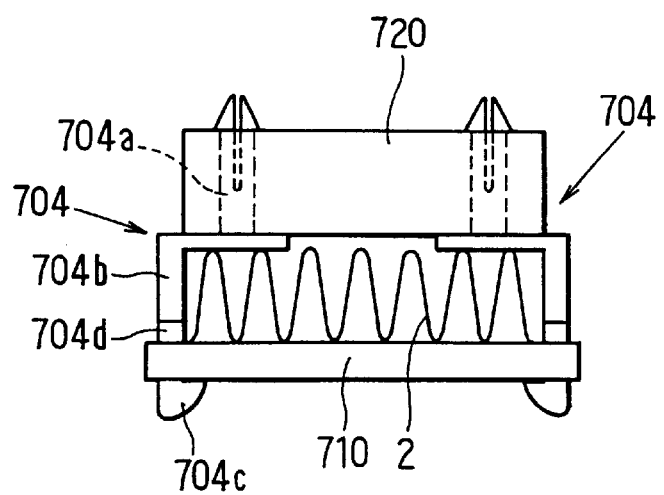

COOLING DEVICE WITH SUPPORT MEMBERS FACING FIN

CROSS REFERENCE TO RELATED APPLICATIONS

This application is based upon and claims the benefit of Japanese Patent Applications No. 10-369082, filed on Dec. 25, 1998, No. 10-369083 filed on Dec. 25, 1998, No. 10-369084 filed on Dec. 25, 1998, No. 10-369085 filed on Dec. 25, 1998, No. 10-369086 filed on Dec. 25, 1998, No. 11-96844 filed on Apr. 2, 1999, No. 11-122521 filed on Apr. 28, 1998, and No. 11-203564 filed on Jul. 16, 1999, the contents of which are incorporated herein by reference.

BACKGROUND OF THE INVENTION

1. Field of the Invention

This invention relates to a cooling device suitable for cooling an electronic part such as a microprocessor unit, which generates heat.

2. Description of the Related Art

JP-A-8-83873 discloses a cooling device for cooling a microprocessor unit. The cooling device has a radiation plate integrally formed with a radiation fin. The radiation fin is formed by partially cutting and bending the radiation plate. However, it is difficult for the radiation fin, which is integrally formed with the radiation plate, to provide a sufficient radiation area.

SUMMARY OF THE INVENTION

The present invention has been made in view of the above problem. An object of the present invention is to increase a radiation area by adopting a corrugated fin to reduce size and weight as a whole. Another object of the present invention is to securely protect a corrugated fin not to be crushed by external force.

According to the present invention, briefly, a cooling device for radiating heat from a heat radiating member has a radiation plate, a corrugated fin disposed on the radiation plate, a blower, and a blower case covering the blower, and first and second support members connected to the radiation plate. The first and second support members face the corrugated fin at both sides in a corrugated direction of the corrugated fin. The corrugated fin increases a radiation area largely, resulting in effective heat radiation from the heat generating member. The first and second support members protect the corrugated fin from an external force.

The first and second support member can be fixed to the radiation plate by an elastic force thereof. Accordingly, the fixation is readily achieved with a simple structure. The first and second support members may be integrally formed with either one of the blower case and the radiation plate. Otherwise, the first and second support members may be separate from both the blower case and the radiation plate. A support casing connected to the blower case and the radiation fin can have the first and second support members.

BRIEF DESCRIPTION OF THE DRAWINGS

Other objects and features of the present invention will become more readily apparent from a better understanding of the preferred embodiments described below with reference to the following drawings, in which:

FIG. 10 is a cross-sectional view taken along line X—X FIG. 8;

FIG. 11 is a cross-sectional view showing a main part of a modified example of the second embodiment;

FIG. 12A is a front view showing a cooling device in third preferred embodiment;

FIG. 12B is a side view showing the cooling device shown in FIG. 12A observed from a direction perpendicular to a corrugated direction of a corrugated fin;

FIG. 12C is a side view showing the cooling device shown in FIG. 12A observed from a direction parallel to the corrugated direction of the corrugated fin;

FIG. 13A is a front view showing a resin support;

FIG. 13B is a side view showing the resin support from a direction indicated with arrow XIIIB in FIG. 13A;

FIG. 13C is a side view showing the resin support from a direction indicated with arrow XIIIC in FIG. 13B;

FIG. 14 is a side view showing a modified example of the third embodiment according to the present invention;

FIG. 15A is a side view showing a modified resin support of the third embodiment;

FIG. 15B is a side view showing the resin support from a direction indicated with arrow XVB in FIG. 15A;

FIG. 15C is a side view showing the resin support from a direction indicated with arrow XVC in FIG. 15B;

FIG. 16 is a side view showing a modified example of the third embodiment;

FIG. 53A is a front view showing a resin support in the tenth embodiment;

FIG. 53B is a side view showing the resin support taken in a direction indicated by arrow LIIIB in FIG. 53A;

FIG. 53C is a cross-sectional view showing the resin support taken along line LIIIC—LIIIC in FIG. 53A;

FIG. 54 is a side view showing a modification of the tenth embodiment;

Figure 1:
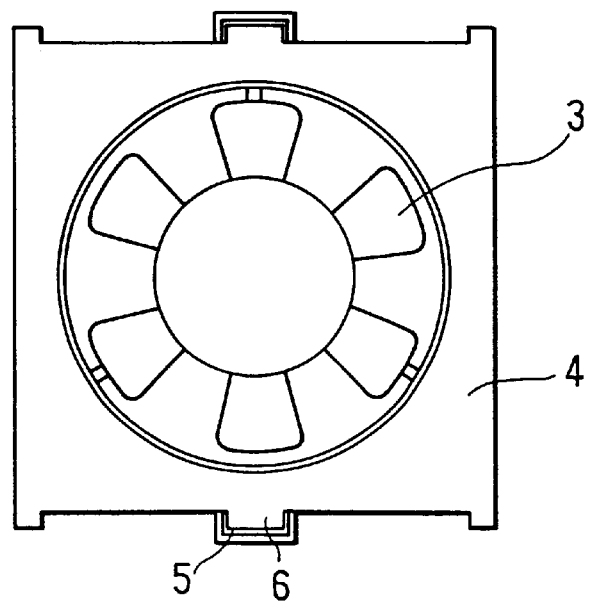
FIG. 1 is a front view showing a cooling device according to a first preferred embodiment of the present invention.
Figure 2:
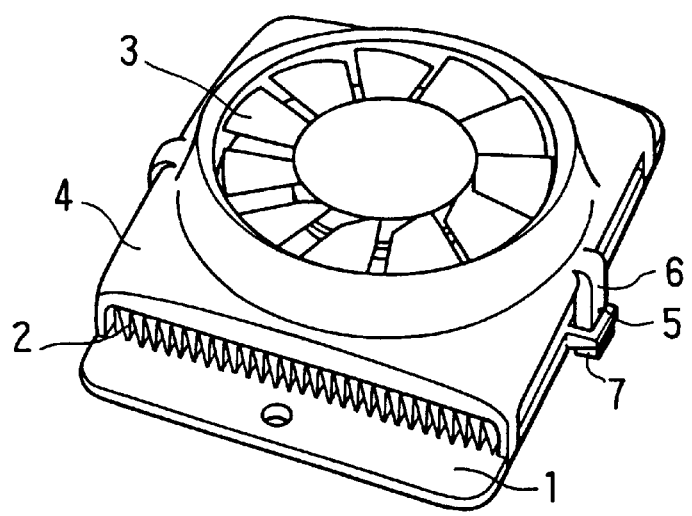
FIG. 2 is a perspective view showing the cooling device shown in FIG. 1.
Figure 3:
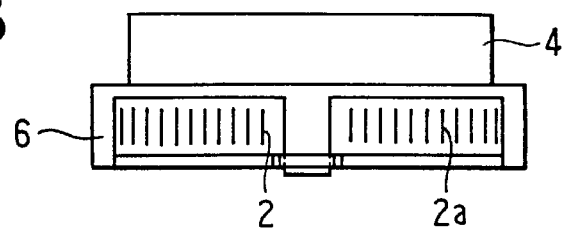
FIG. 3 is a side view showing the cooling device shown in FIG. 1.
Figure 4:
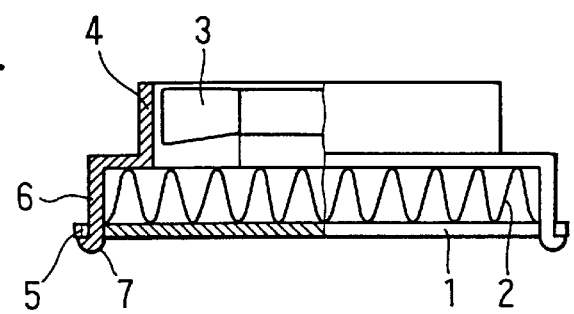
FIG. 4 is a partially cross-sectional view showing the cooling device shown in FIG. 1.

DETAILED DESCRIPTION OF THE PREFERRED EMBODIMENTS (First Embodiment)

FIGS. 1 through 5 show a cooling device for cooling an electronic part not shown, according to a first preferred embodiment.

In the figures, reference numeral 1 denotes a radiation plate made of aluminum alloy having a thickness in a range of approximately 1 mm to 5 mm, and sized with a side of approximately 5 cm. A corrugated fin 2 is also made of aluminum alloy and is thermally joined to the radiation plate 1 by brazing or the like. The corrugated fin 2 is formed from a bar having a thickness of approximately 0.1 mm. The surface of the radiation plate 1 for facing the corrugated fin 2 is cladded with brazing filler metal. The corrugated fin 2 disposed on the surface of the radiation plate 1 is put into a furnace and is integrally brazed to the surface of the radiation plate 1. The other surface of the radiation plate 1 to which the corrugated fin 2 is not brazed serves as an installation surface for attaching the cooling device to the electronic part. The corrugated fin 2 is formed with louvers 2a by cutting and bending the corrugated fin 2.

A blower 3 blows cooling air toward the corrugated fin 2. The blower 3 has a small size with a diameter in a range of approximately 3 to 8 cm, and holds a D.C. brushless motor inside thereof. The brushless motor is sized small and has approximately 1 to 3 W to rotate the blower 3. A blower case 4 covers the blower 3 and guides cooling air from the blower 3. The blower case 4 is made of, for example, saturated polyester or ABS resin, which is fire retarding resin.

The blower case 4 is integrally formed with leg portions 6 protruding at both sides in a corrugated direction of the corrugated fin 2. In the present embodiment, the leg portions 6 are provided at six portions, three of which are at both ends and the center of a side, and other three of which are at the opposite side. The radiation plate 1 has installation holes 5 at positions opposed to the leg portions 6, and the leg portions 6 are inserted into the installation holes 5. Each of the leg portions 6 has an engagement portion 7 at a front end thereof for preventing detachment thereof from the installation holes 5. When the leg portions 6 fit the installation holes 5, the engagement portions 7 keep the connection between the blower case 4 and the radiation plate 1.

Next, the operation of the cooling device in the present embodiment will be explained. The brushless motor starts to rotate by turning on a switch not shown, and accordingly, the blower 3 rotates inside the blower case 4. Cooling air generated by the blower 3 and the blower case 4 flows toward a side of the corrugated fin 2, and passes through the louvers of the corrugated fin 2 while exchanging heat with the corrugated fin 2.

The radiation plate 1 is disposed in close contact with the electronic part, as a heat generating member, so that the radiation plate 1 is heated by heat from the electronic part. Heat is further transmitted from the radiation plate 1 to the corrugated fin 2. Then, the heat exchange between the corrugated fin 2 and cooling air from the blower 3 is performed. As a result, heat is radiated from the electronic part through the radiation plate 1.

The corrugated fin 2 is formed from a thin aluminum plate having a thickness of approximately 0.1 mm and has the plural louvers 2a cut and bent-up therefrom, thereby improving radiation performance. However, because especially the louvers 2a are very weak to an external force, it is desirable that the louvers 2a are not directly exposed to an outer space.

Because of this, according to the present embodiment, the surface on which the louvers 2a are formed, i.e., both side surfaces of the corrugated fin 2 in the corrugated direction are covered with the leg portions (protective members, support members) 6 integrally formed with the blower case 4. That is, the leg portions 6 of the blower case 4 are positioned at the outside of the both sides of the corrugated fin 2, so that the corrugated fin 2, especially the louvers 2a are protected by the leg portions 6.

In addition, the leg portions 6 integrated with the blower case 4 are fixed to the radiation plate 1 using elastic strength of resin. Accordingly, the connection between the blower case 4 and the radiation plate 1 is achieved with an extremely simple structure. Not only a number of parts but also assembling man-hour is reduced as compared to a case where the blower case 4 and the radiation plate 1 are connected with each other by separate parts such as screws. Incidentally, the thickness of each of the blower case 4 and the leg portions 6 is set in a range of approximately 1 mm to 3 m so that the elastic strength of resin is sufficiently utilized.

Figure 5A:
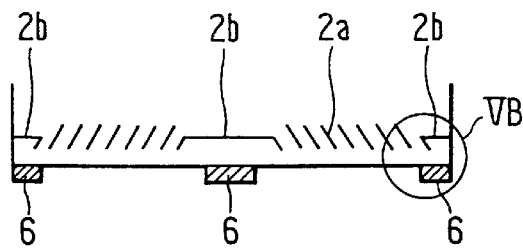
FIG. 5A is a cross-sectional view partially showing an arrangement of louvers in the cooling device shown in FIG. 1.
Figure 5B:
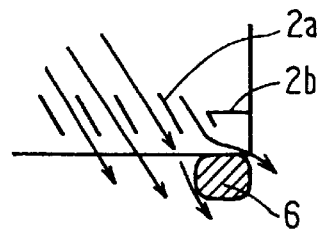
FIG. 5B is an enlarged view showing a portion surrounded by circle VB in FIG. 5A.
Figure 6:
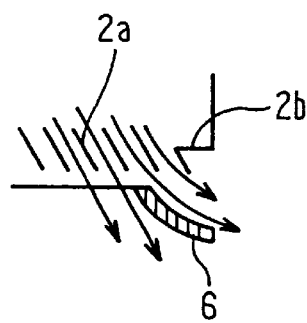
FIG. 6 is a schematic view showing a modified leg portion in the first embodiment.
Figure 7:
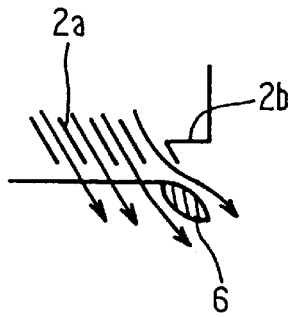
FIG. 7 is a schematic view showing another modified leg portion in the first embodiment.
Figure 8:
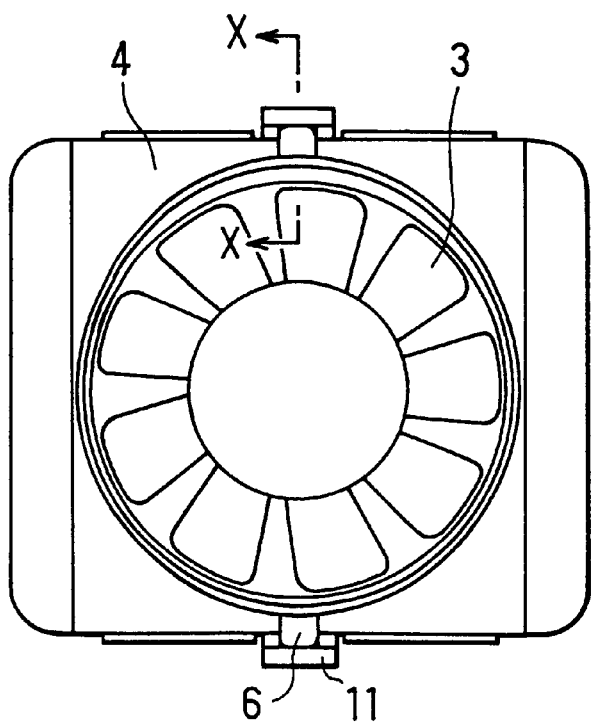
FIG. 8 is a front view showing a cooling device according to a second preferred embodiment of the present invention.
Figure 9:
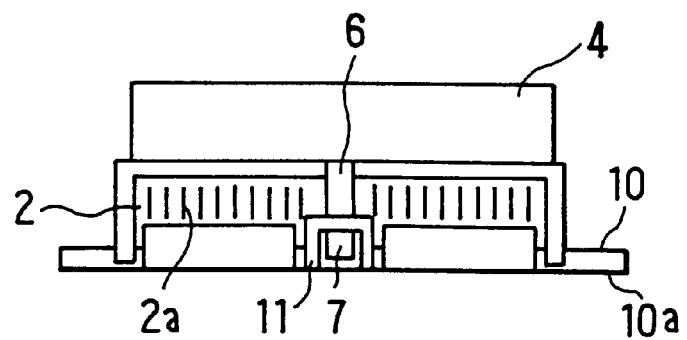
FIG. 9 is a side view showing the cooling device shown in FIG. 8.

In the first embodiment shown in FIGS. 1–4, the louvers 2a are cut and bent-up to form a V-like shape so that cooling air flows toward a periphery. Therefore, as shown in FIG. 5A, a portion 2b where no louver 2a is formed exists between left side louvers 2a and right side louvers 2a. Other portions 2b where no louver 2a is formed exist at edge portions of the corrugated fin 2. The leg portions 6 are disposed to face the portions 2b where no louver 2a is formed. As a result, as shown in FIG. 5B, cooling air passing through the louvers 2a is not largely disturbed by the leg portions 6. FIGS. 6 and 7 show other examples of the leg portions 6 having different shapes from those disposed at both ends shown in FIG. 5A. The leg portions 6 are shaped in cross-section to have contours along the flow of cooling air that has passed through the louvers 2a. The louvers 2a may be radially arranged on the corrugated fin 2 in stead of forming a V-like shape.

(Second Embodiment)

In the first embodiment, the engagement portions of the leg portions protrude from the installation surface of the radiation plate; however, this structure produces a gap between the electronic part and the installation surface of the radiation plate. Therefore, there is a case where tightness between the two members is insufficient for providing sufficient cooling performance. From the view of this point, in a second preferred embodiment, portions of a radiation plate to which the engagement portions of the leg portions are engaged have steps with respect to the installation surface.

FIGS. 8 through 11 show a cooling device in the present embodiment. The same parts and components as those in the first embodiment are indicated with the same reference numerals, and detailed explanation thereof will be omitted.

Attachment portions 11 protrude from an installation surface 10a of a radiation plate 10 to be engaged with engagement portions 7 of leg portions 6. The portions to be engaged with the engagement portions 7 are shifted to a side of a corrugated fin 2 by a distance b as indicated in FIG. 10. Therefore, the leg portions 6 are fixed to the radiation plate 10 without having the front ends thereof protruding from the installation surface 10a of the radiation plate 10. Accordingly, the tightness between the electronic part and the installation surface 10a of the cooling device is improved, resulting in improved cooling performance.

Further, according to the structure described above, because opening edges surrounding installation holes 10b, to which no engagement portion 7 is attached, can served as part of the installation surface 10a, an effective area for transmitting heat is increased.

As another embodiment in which the front ends of the leg portions 6 do not protrude from the installation surface 10a, as shown in FIG. 11, the portions where the installation holes 10b for the leg portions 6 are provided may be bent to form steps at the side of the corrugated fin 2 with a distance b from the installation surface 10a.

(Third Embodiment)

In the first and second embodiments, the leg portions as protective members are integrally formed with the blower case; however, they may be separately formed with the blower case as described below. FIGS. 12 through 17 show a third preferred embodiment, in which the same parts as those in the first embodiment are indicated with the same reference numerals, and detailed explanation thereof will be omitted.

Reference numeral 20 denotes a blower case covering a blower 3 for guiding cooling air produced by the blower 3. The blower case 20 is made of, for example, saturated polyester or ABS resin. Installation holes 20a are formed at the four corner portions of the blower case 20 for receiving connecting portions described below.

Reference numeral 21 is a pair of resin supports (connecting member) made of saturated polyester, ABS resin, or the like. The blower case 20 and the radiation plate 1 are connected to each other by the pair of resin supports 21. As shown in FIGS. 13A to 13C, each of the resin supports 21 has a plate portion 22 defining therein a part of an opening portion connecting the inside of the blower case 20 and the corrugated fin 2, a leg portion 23 extending from a surface of the plate portion 22, and two connecting portions 24 extending from the other surface of the plate portion 22.

The leg portion 23 is formed to extend to a side of the radiation plate 1 when the resin supports 21 are attached to the radiation plate 1. The leg portion 23 has a fork end and engagement portions 23a are formed at the fork end for preventing detachment thereof. The leg portion 23 is positioned at a front side or a rear side in a corrugated direction of the corrugated fin 2 when the resin supports 21 are attached to the radiation plate 1.

The connecting portions 24 extend at the side of the lower case 20 when the resin supports 21 are attached to the blower case 20. Each of the resin supports 21 also has a fork end, and engagement portions 24 are formed at the fork end for preventing detachment thereof. The connecting portions 24 are inserted into the installation holes 20a of the blower case 20 when the resin supports 21 are attached to the blower case 20.

The leg portions 23 of the resin supports 21 are elastically deformed to be received in the installation hole 1a of the radiation plate 1, so that the resin supports 21 are connected to the radiation plate 1. The connecting portions 24 of the resin supports 21 are also elastically deformed to be received in the installation holes 20a of the blower case 20, so that the resin supports 21 are connected to the blower case 20. Consequently, the blower case 20 is connected to the radiation plate 1 through the resin supports 21.

According to the present embodiment, the leg portions 23 of the resin supports 21 face the surfaces of the corrugated fin 2 on which the louvers 2a are formed, i.e., both corrugated surfaces of the corrugated fin 2, to cover the corrugated fin 2. In other words, the leg portions 23 of the resin supports 21 are disposed at both outer sides of the corrugated fin 2, so that the corrugated fin 2, especially the louvers 2a are protected by the leg portions 23.

Figure 17:
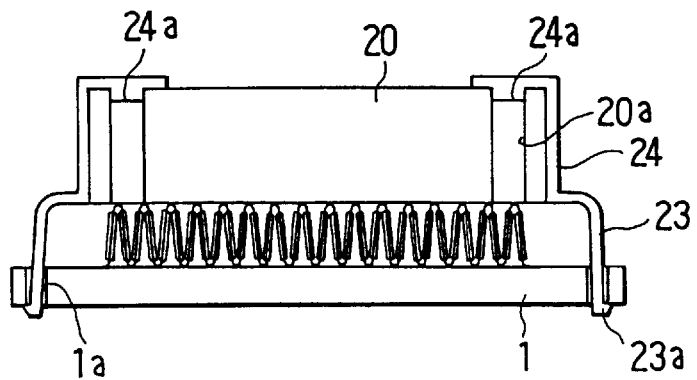
FIG. 17 is a side view showing a modified example of the third embodiment.

The leg portions 23 and the connecting portions 24 are not always required to have fork-ends as shown in FIG. 14. Each resin support 21 may have several leg portions 23 as shown in FIGS. 15A to 15C. Also, as shown in FIGS. 16 and 17, resin supports 21 may sandwich the blower case 20 and the radiation plate 1 therebetween.

Figure 18:
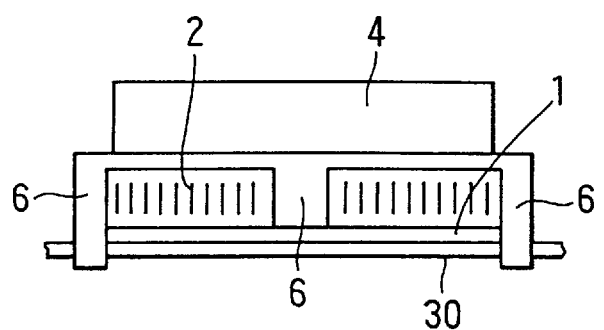
FIG. 18 is a side view showing a modified example of the first embodiment.
Figure 19:
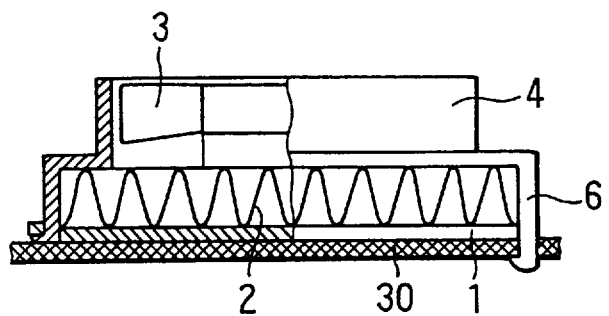
FIG. 19 is a partially cross-sectional view showing the modified example of FIG. 18.

In the first embodiment described above, the leg portions 6 integrated with the blower case perform connection with the radiation plate 1 and protect the fin. However, as shown in FIGS. 18 and 19, fixation of a cartridge 30 of the electronic part may also be performed by the leg portions 6. As described above, because the radiation plate 1 is closely disposed on the electronic part, the tight connection between the radiation plate 1 and the electronic part cartridge 30 can be securely achieved by the structure shown in FIGS. 18 and 19 as an example.

According to the present embodiment, both sides in the corrugated direction of the corrugated fin are covered with the leg portions integrated with the blower case 4. Accordingly, the corrugated fin can be protected securely from external force. Further, the leg portions as protective members integrated with the blower case or provided on the resin supports are joined to the radiation plate 1 by its elasticity. Therefore, the connection between the radiation plate and the blower case is easily achieved with a structure, which has good assembling performance and is manufactured at low cost as a whole.

(Fourth Embodiment)

Figure 20:
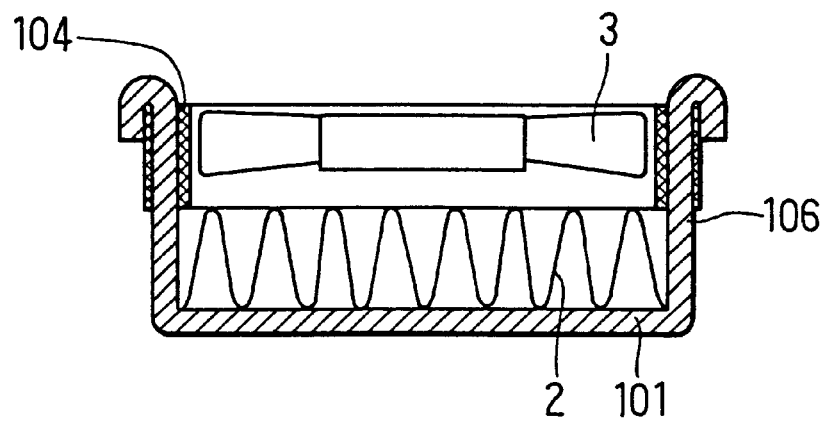
FIG. 20 is a cross-sectional view showing a cooling device in a fourth preferred embodiment.
Figure 21:
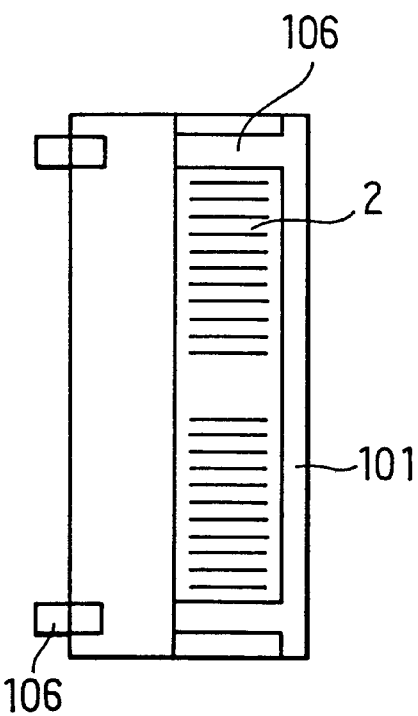
FIG. 21 is a side view showing the cooling device shown in FIG. 20.
Figure 22:
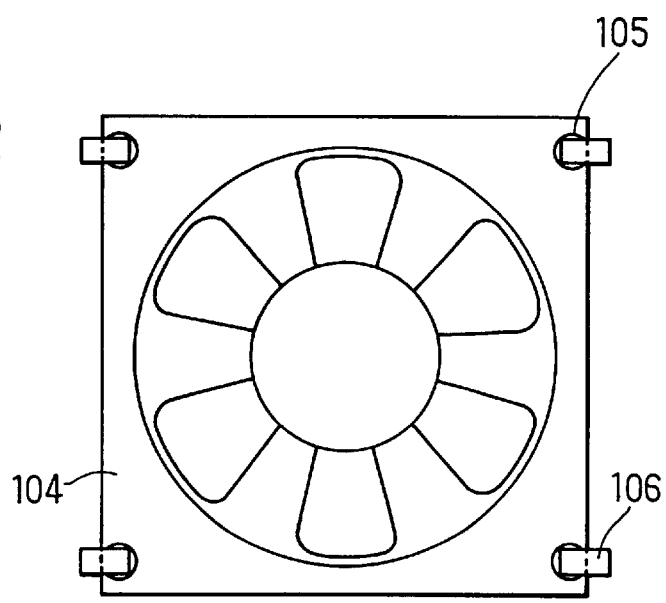
FIG. 22 is a front view showing the cooling device shown in FIG. 20.
Figure 23:
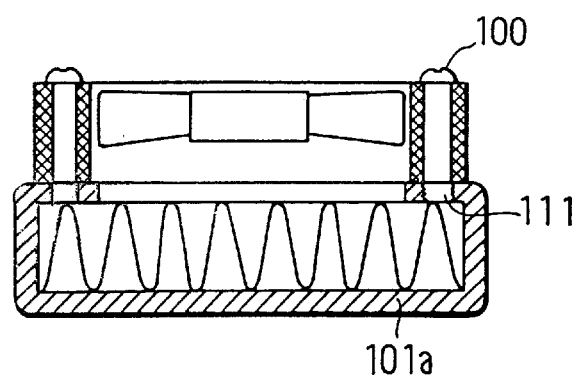
FIG. 23 is a cross-sectional view showing a cooling device in a modified embodiment of the fourth embodiment.
Figure 24:
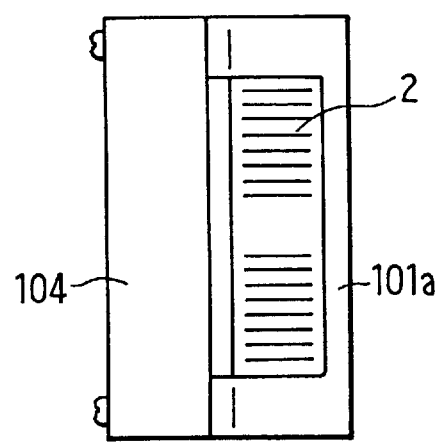
FIG. 24 is a side view showing the cooling device shown in FIG. 23.
Figure 25:
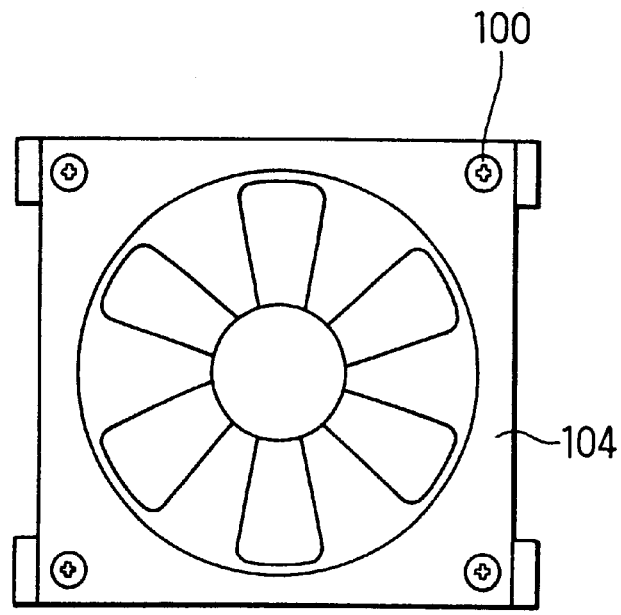
FIG. 25 is a front view showing the cooling device shown in FIG. 23.
Figure 26:
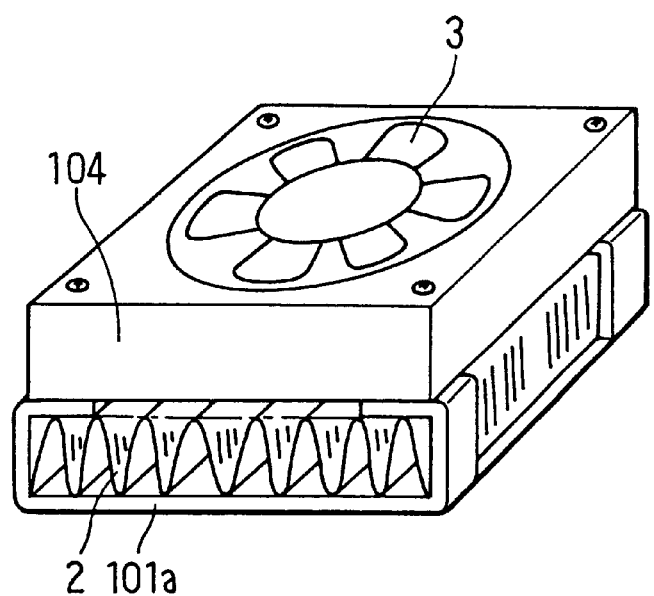
FIG. 26 is a perspective view showing the cooling device shown in FIG. 23.

FIGS. 20 to 22 show a cooling device in a fourth preferred embodiment, in which the same parts as those in the first embodiment are indicated with the same reference numerals and those detailed explanation will be omitted.

In the fourth embodiment, installation holes 105 are defined in four corner of a blower case 104 made of saturated polyester, ABS resin, or the like. Each two leg portions 106 are integrally formed with a radiation plate 101 by bending at both sides in a corrugated direction of a corrugated fin 2. The radiation plate 101 is formed from an aluminum alloy plate having a thickness in a range of approximately 1 to 5 mm. As shown in FIG. 20, the bent leg portions 106 penetrate the installation holes 105 of the blower case 104, and are formed to fix the blower case 104. The blower case 104 can served as a shroud for guiding cooling air from a blower 3 to the corrugated fin 2. The other features are the same as those in the first embodiment.

FIGS. 23 to 26 show a modified embodiment of the fourth embodiment. In this embodiment, the blower case 104 is fixed to a radiation plate 101a at leg portions thereof by screws 100. This case, however, necessitates the four extra screws 100. In addition, the radiation plate 101a must be formed to have U-like shapes at both ends and to have female screws 111 at the leg portions thereof. This results in increase in cost as compared to the fourth embodiment shown in FIGS. 20 to 22.

Figure 27:
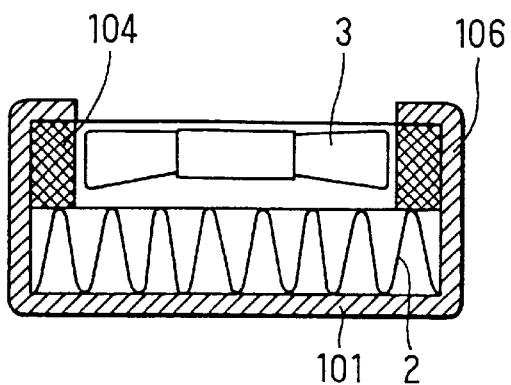
FIG. 27 is a cross-sectional view showing another modified embodiment of the fourth embodiment.
Figure 28:
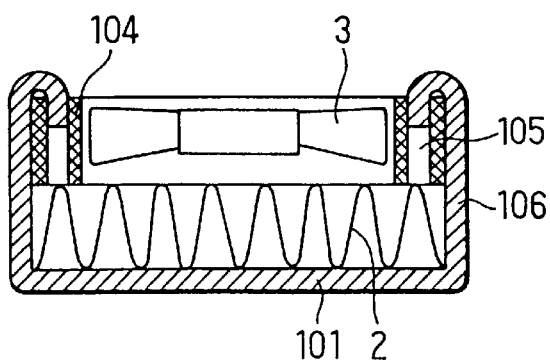
FIG. 28 is a cross-sectional view showing another modified embodiment of the fourth embodiment.

FIGS. 27 and 28 show other modified embodiments of the fourth embodiment. The leg portions 106 of the radiation plate 101 passing through the installation holes 105 are formed in the fourth embodiment as shown in FIGS. 20 to 22. However, as shown in FIG. 27, the leg portions 106 may form both side faces of the blower case 104. As shown in FIG. 28, the leg portions 106 of the radiation plate 101 may be inserted into the installation holes 105 from the upper face side of the blower case 104 while pushing the blower case 104.

In the fourth embodiment, the leg portions 106 are formed by bending at the four corners of the radiation plate 101. Another leg portion may be formed at the central portion of the radiation plate 101 to protect the corrugated fin. Although the radiation plate 101 and the corrugated fin 2 are connected to each other by brazing in the embodiments described above, they may be connected by other manners such as ultrasonic welding.

According to the fourth and modified embodiments described above, the leg portions are integrally formed with the radiation plate, and are fixed to the blower case by forming or by using the screws, thereby reducing assembling cost. In addition, because the leg portions of the radiation plate are positioned at the both ends in the corrugated direction of the corrugated fin, the leg portions can protect the corrugated fin. In addition, an area where the corrugated fin is provided is increased to provide a sufficient radiation area, resulting in improvement of cooling performance.

(Fifth Embodiment)

Figure 29:
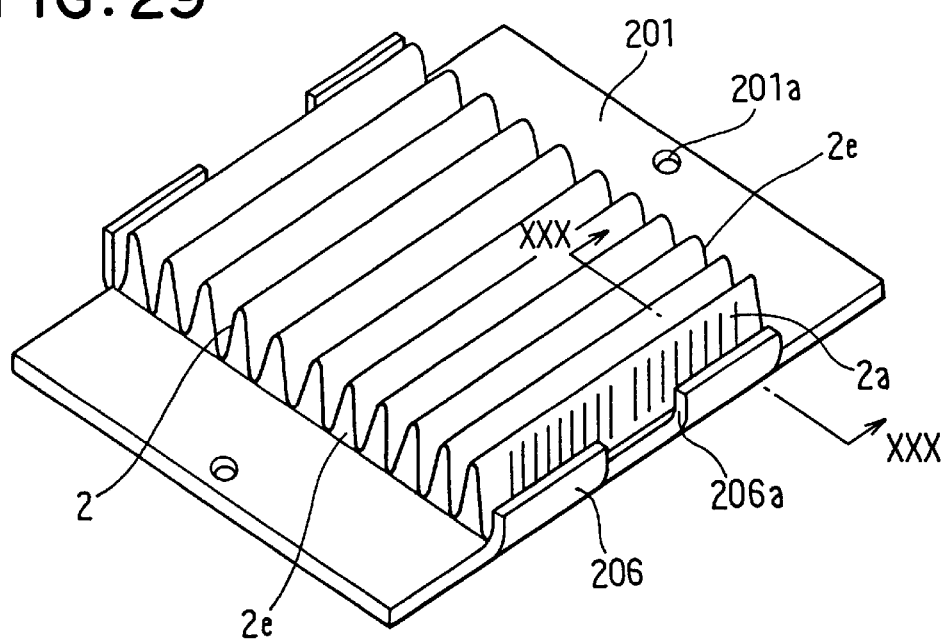
FIG. 29 is a perspective view showing a corrugated fin and a radiation plate in a fifth preferred embodiment.

A fifth preferred embodiments of the present invention is explained with reference to FIGS. 29 to 35, in which the same parts and components as those in the first embodiment are indicated with the same reference numerals. In FIG. 29, a radiation plate 201 and a corrugated fin 2 are brazed to each other. That is, the surface of the radiation plate 201 for facing the corrugated fin 2 is cladded with brazing filler metal in advance. The corrugated fin 2, which is a bare member on which no brazing filler metal is cladded, and the radiation plate 201 are assembled as shown in FIG. 29, and are transferred into a furnace. The brazing filler metal on the radiation plate 201 is fused within the furnace, so that the corrugated fin 2 and the radiation plate 201 are thermally joined to each other.

Engagement portions (support members) 206 are integrally formed with the radiation plate 201 by partially bending the radiation plate 201 to face the corrugated fin 2 at both sides in the corrugated direction. The engagement portions 206 have large opening portions 206a not to disturb the flow of cooling air coming out of the louvers 2a of the corrugated fin 2. The height of the engagement portions 206 is less than approximately a half of that of the corrugated fin 2 so that an adverse effect by the engagement portions 206 against the flow of cooling air is decreased as small as possible.

Figure 30:
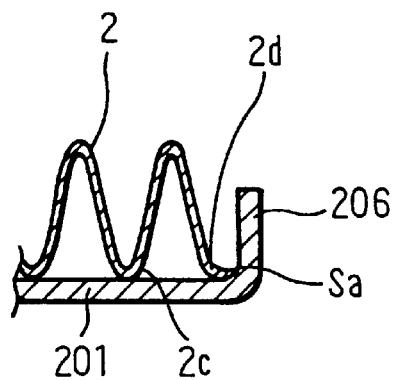
FIG. 30 is a cross-sectional view taken along line XXX—XXX line in FIG. 29.

As shown in FIG. 30, the corrugated fin 2 has an end portion 2d in the corrugated direction, and the end portion 2d is disposed in contact with or in close proximity to the radiation plate 201. That is, the corrugated fin 2 abuts a portion between the radiation plate 1 and the engagement portions 206 at the end portion 2d. Accordingly, when the corrugated fin 2 is brazed to the radiation plate 201, brazing filler metal cladded on the radiation plate 201 fills gaps between bent portions 2c of the corrugated fin 2 and the radiation plate 201, and space Sa defined by the end portion 2d of the corrugated fin 2, the engagement portions 206, and the radiation plate 201, thereby providing a desirable fillet.

Figure 31:
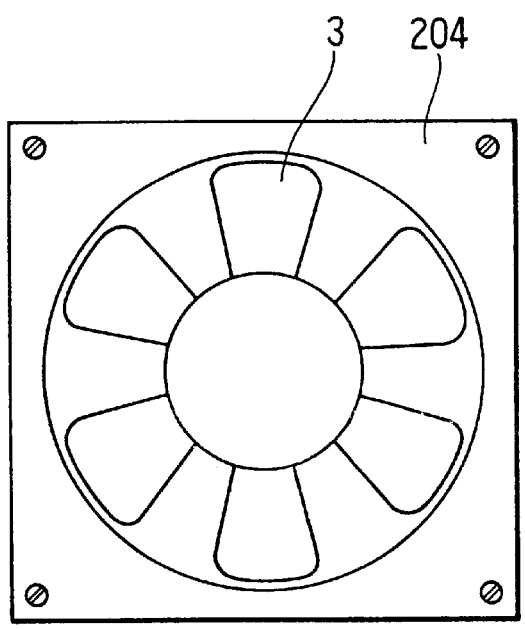
FIG. 31 is a front view showing a state where a blower is attached.
Figure 32:
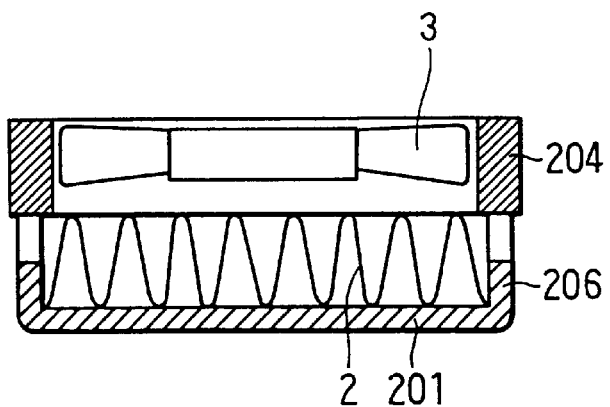
FIG. 32 is a cross-sectional view showing the state in FIG. 31.

FIGS. 31 and 32 shows an example in which a blower 3 is disposed. The blower has a diameter in a range of 3 to 8 mm, and a D.C. brushless motor of 1 to 3 W is disposed at the center of the blower 3. A blower case 204 covers the blower 3 to guide cooling air produced by the blower 3 toward the corrugated fin side. The blower case 204 is connected to the radiation plate 201 by screws or the like. A heat generating member such as an electronic part contacts the radiation plate 201 so that heat is transferred to the corrugated fin side, and the heat transferred to the corrugated fin 2 is effectively radiated by cooling air from the blower 3.

Referring again to FIG. 29, radiation air from the lower 3 flows out through opening ends 2e of the corrugated fin 2 and opening portions 206a of the engagement portions 206. Therefore, the engagement portions 206 do not largely increase flowing resistance of cooling air from the blower 3.

Figure 33A:
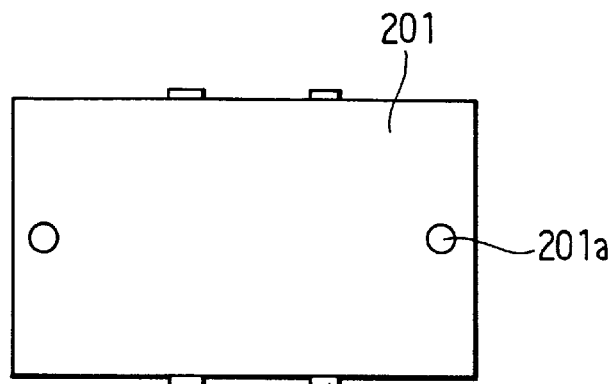
FIGS. 33A and 33B are front and side views showing another example of the radiation plate in the fifth embodiment.
Figure 33B:
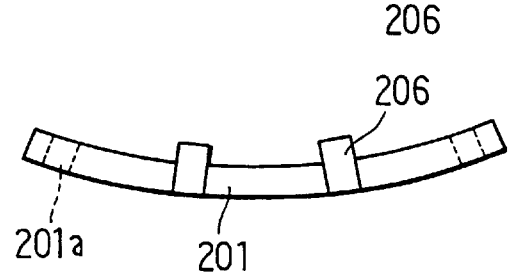

In the fifth embodiment, although the radiation plate 201 is flat, as shown in FIGS. 33A and 33B, the radiation plate 201 may be curved. This is to secure tight connection between the radiation plate 201 and the electronic part when the radiation plate 201 is closely attached to an electronic part package via installation holes 201a thereof. When the engagement portions 206 are formed by bending the radiation plate 201, rigidity may be increased. However, according to the present embodiment, because the large opening portions 206a are provided, formation of the engagement portions 206 by bending is not difficult.

Figure 34A:
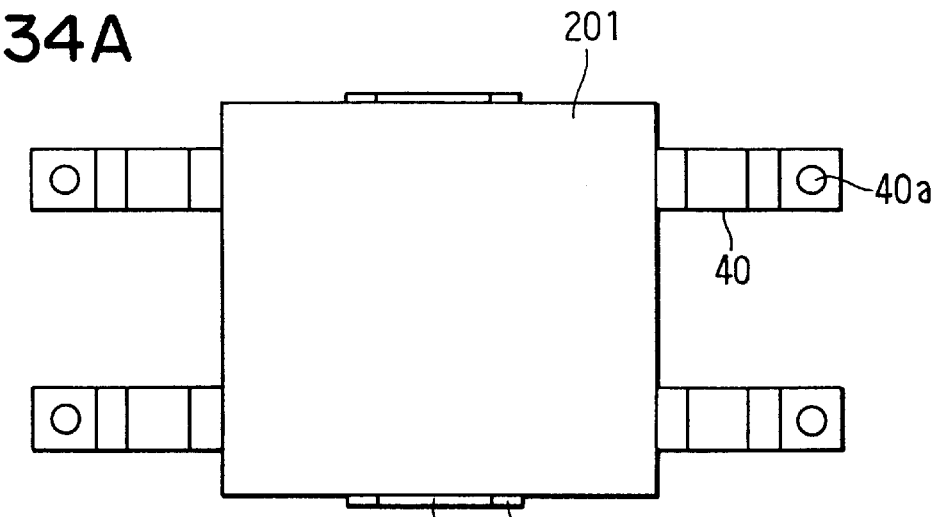
FIGS. 34A and 34B are front and side views showing another example of the radiation plate in the fifth embodiment.
Figure 34B:
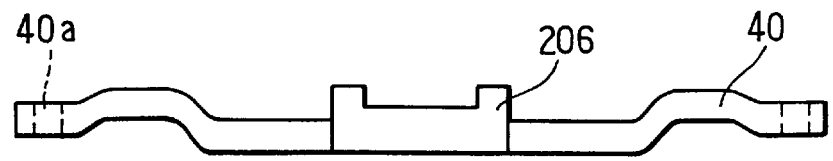

FIGS. 34A and 34B shows another modification of the fifth embodiment, in which installation legs 40 integrally protrude from the radiation plate 201. As shown in FIG. 34B, the radiation plate 201 protrudes toward the electronic part side more than the installation legs 40 by approximately 0.5 to 1 mm. Accordingly, the radiation plate 201 can contact the electronic part under pressure in a state where the installation legs 40 are connected to the electronic part package via installation holes 40a by elastic deformation thereof.

Figure 35:
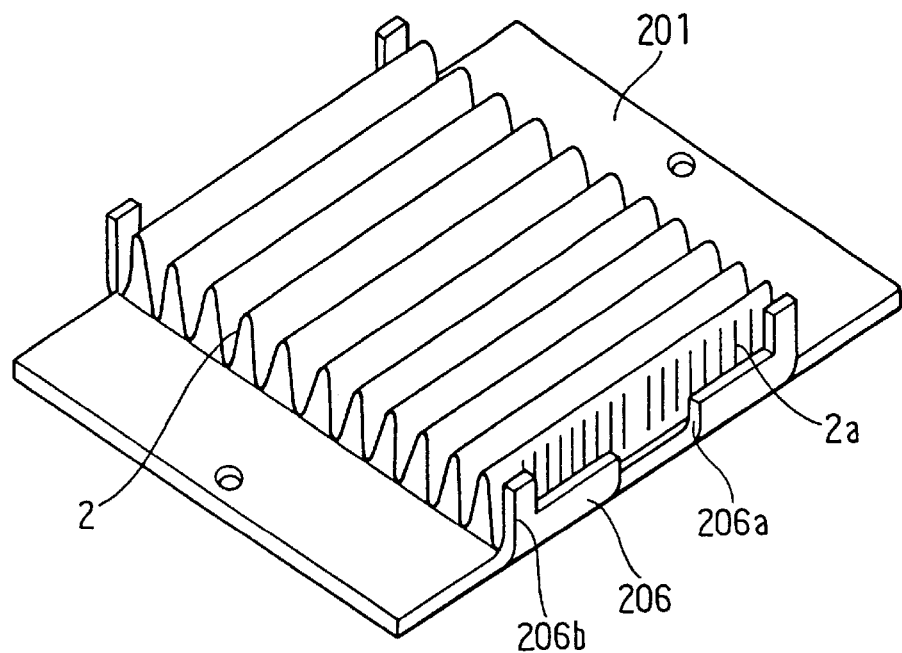
FIG. 35 is a perspective view showing a modified example of the radiation plate holding the corrugated fin in the fifth embodiment.

In the fifth embodiment, the height of the engagement portions 206 is less than approximately an half of that of the corrugated fin 2. However, as shown in FIG. 35, extending portions 206b partially protruding from the engagement portions 206 may be provided so that the height of the engagement portions 206 is approximately equal to that of the corrugated fin 2 at both sides thereof. The extending portions 206b face portions of the corrugated fin 2 where no louver 2a is provided. Therefore, the extending portions 206b do not largely disturb cooling air flow from the blower 3.

The connection between the installation legs 40 and the heat generating member such as the electronic part is not limited to the screwing method using the installation holes 40a, but may be performed by other manners such as forming. Although the brazing filler metal is cladded to the radiation plate in the embodiment described above, it may be cladded to the corrugated fin.

According to the present embodiment, the engagement portions are formed integrally with the radiation plate by partially bending the radiation plate at both ends in the corrugated direction of the corrugated fin. The end of the corrugated fin in the corrugated direction abuts the portion between the radiation plate and the engagement portions. Therefore, the positioning between the corrugated fin and the radiation plate can be securely performed. This implies that the corrugated fin can be sufficiently brazed to the radiation plate. In addition, because the engagement portions cover the outer portions of the corrugated fin in the corrugated direction to protect outer surfaces of the corrugated fin, the corrugated fin is not easily deformed by external force applied thereto.

(Sixth Embodiment)

Figure 36:
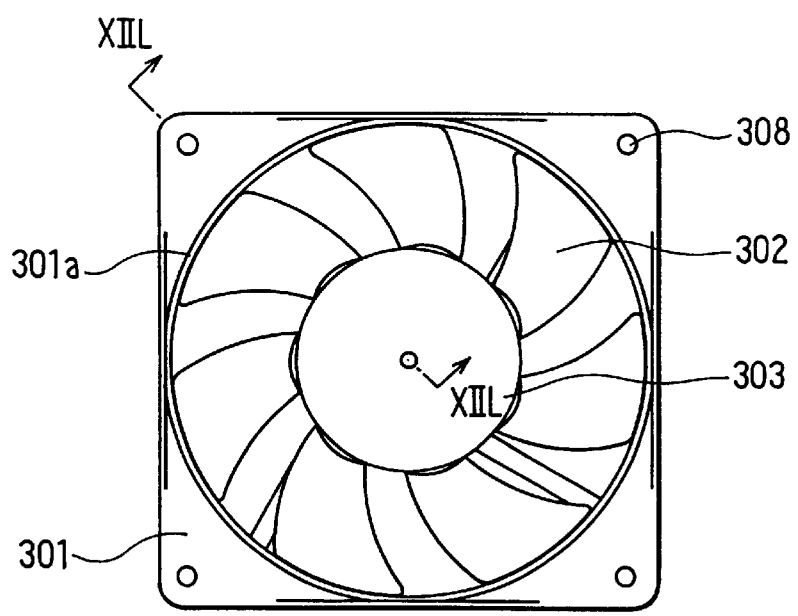
FIG. 36 is a front view showing a cooling device in a sixth preferred embodiment.

A sixth preferred embodiment is explained with reference to FIGS. 36 to 38. As shown in FIGS. 36 and 38, reference numeral 302 denotes a blower, and plural blades are provided around a cylindrical boss part 303, thereby forming the blower 302. A D.C. brushless motor 304 is disposed on the back surface of the boss part 303 to drive the blower 302. The motor 304 is a small type of approximately 1 to 3 W. A blower case 301 integrally formed from resin such as saturated polyester or ABS resin covers the blower 302. The blower case 301 has a cylindrical shroud portion 301a covering the blower 302. The shroud portion 301a has a bell-mouth shape in cross-section to have a smoothly inclined surface for facing the blower 302.

In FIG. 38, cooling air flow F progresses downwardly from the blower 302 toward a radiation plate 306 as indicated by an arrow. In the present embodiment, the shroud portion 301a defines an air passage in which cooling air flows. In this example, an upstream side edge portion 301b of the shroud portion 301a has an R-like shape so that a thickness in a radial direction thereof is increased along cooling air flow F. On the other hand, at a downstream side of cooling air flow F, the shroud portion 301a has a bell-mouth shaped edge portion 301c so that the thickness in the radial direction thereof is decreased along cooling air flow F. Accordingly, cooling air is guided along the R-shaped upstream side edge portion 301b smoothly, and is pushed out along the bell-mouth shaped downstream side edge portion 301c smoothly so that cooling air flow F is changed from an axial flow into a slope flow.

Figure 37:
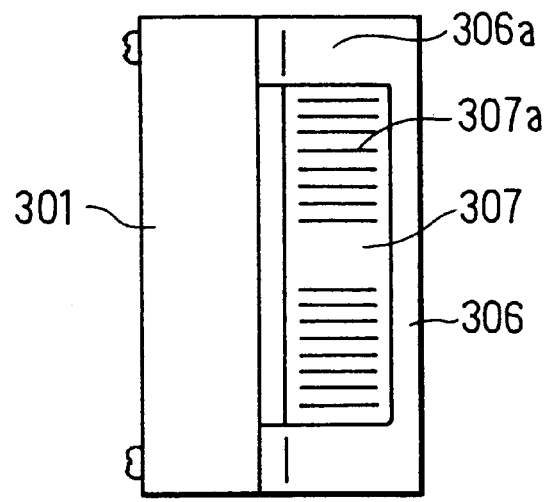
FIG. 37 is a side view showing the cooling device in the sixth embodiment.
Figure 38:
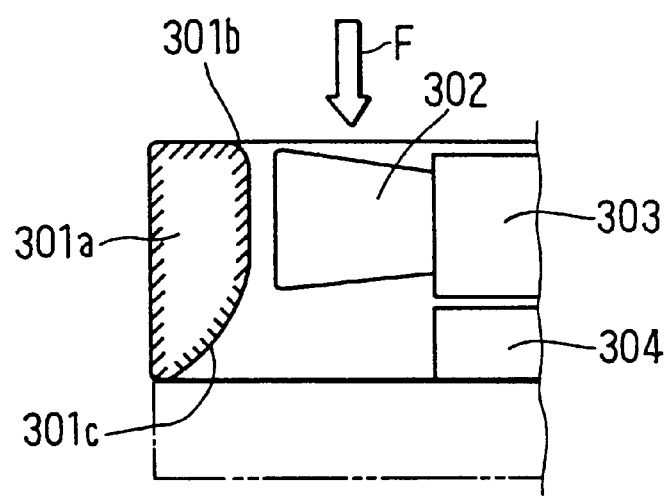
FIG. 38 is a cross-sectional view taken along line XIIL—XIIL in FIG. 36.

Therefore, as shown in FIG. 37, even when cooling air has relatively large pressure loss by passing through louvers 307a of a corrugated fin 307 disposed at a downstream side of the blower 302, the blower 302 can produce sufficient cooling air without having an increased large size. That is, cooling air blown out from the blower 302 toward the corrugated fin side flows toward an outer circumferential side of the radiation plate 306 along the surface of the plate 306 while passing through the louvers 307a of the corrugated fin 307. At that time, the bell-mouth shaped downstream side edge portion 301c of the shroud portion 301a facilitates cooling air to flow outwardly in the radial direction.

The corrugated fin 307 is made of an aluminum alloy plate having a thickness of approximately 0.1 mm, and is thermally joined to the radiation plate 306, which is also made of aluminum alloy, by brazing or the like. The radiation plate 306 closely contacts an electronic part not shown with thermal conductivity to receive heat generated by the electronic part. In the present embodiment, the resin blower case 301 is connected to the radiation plate 306 made of aluminum ally by the screws 308; however the connecting method is not limited to it. The radiation plate 306 and the blower case 301 may be assembled with each other utilizing elasticity of either one thereof. As shown in FIG. 37, the radiation plate 306 has leg portions 306a formed by bending and the leg portions 306a cover the corrugated fin 307 at both sides in the corrugated direction of the corrugated fin 307.

(Seventh Embodiment)

Figure 39:
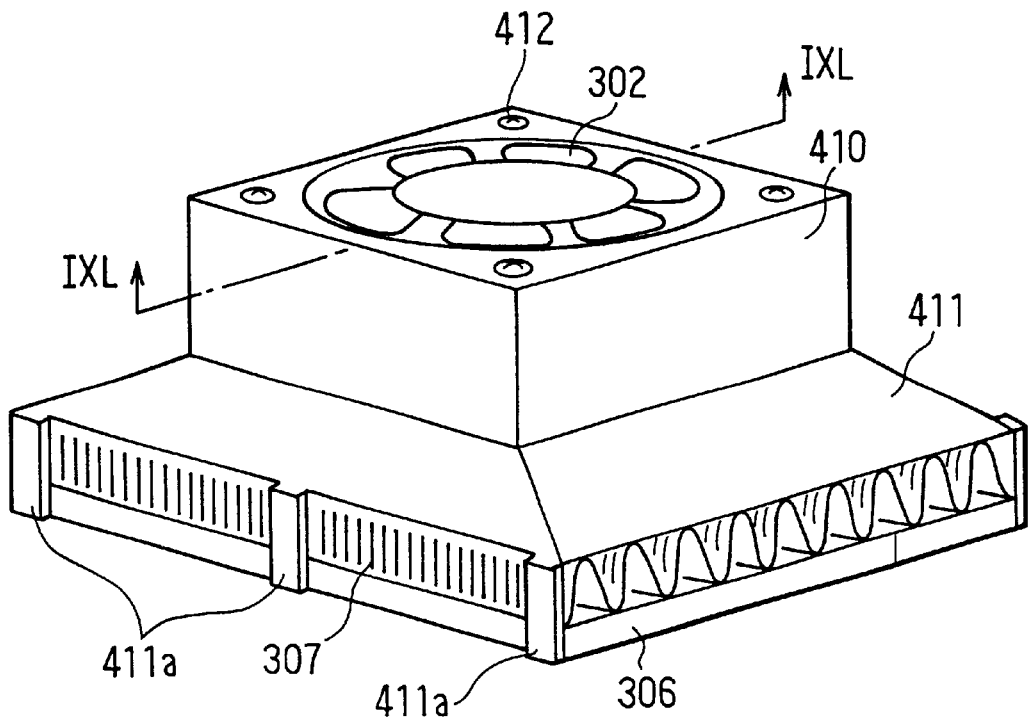
FIG. 39 is a perspective view showing a cooling device in a seventh preferred embodiment.

In a seventh preferred embodiment, a support casing for holding a radiation plate is provided separately from a blower case so that high cooling performance can be provided when a radiation core is larger than the blower case. An air passage is defined by the support casing. The seventh embodiment is explained below with reference to FIGS. 39 to 41.

Reference numeral 410 denotes a blower case for covering a blower 302. The blower case 410 is made of the same material as that in the sixth embodiment, and is formed with a cylindrical shroud portion 410a covering the blower 302. Reference numeral 411 denotes a support casing, which is integrally formed with several leg portions 411a. A radiation plate 306 and a corrugated fin 307 brazed to the radiation plate 306 are held in the support casing 411 by connecting engagement portions formed at front ends of the leg portions 411a to the radiation plate 306. At that time, the leg portions 411a are attached to the radiation plate 306 to cover both sides in the corrugated direction of the corrugated fin 307. Accordingly, the corrugated fin 307 can be prevented from being easily deformed by external force applied thereto.

Figure 40:
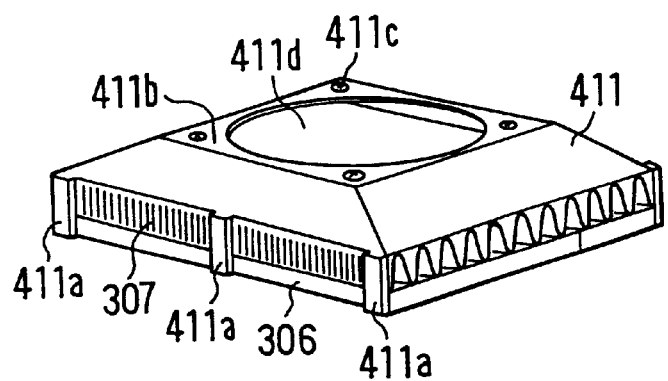
FIG. 40 is a perspective view showing a support casing before a blower case is attached thereto in the seventh embodiment.

The support casing 411 has an installation surface 411b to which the blower case 410 is attached at an upper side in FIG. 40. Installation holes 411c are formed in the installation surface 411b to receive screws 412 for fixing the blower case 410. A large opening portion 411d having a diameter equal to or larger than that of the blower 302 is formed in the installation surface 411b at a position facing the blower 302 when the blower case 410 is attached to the support casing 411.

Figure 41:
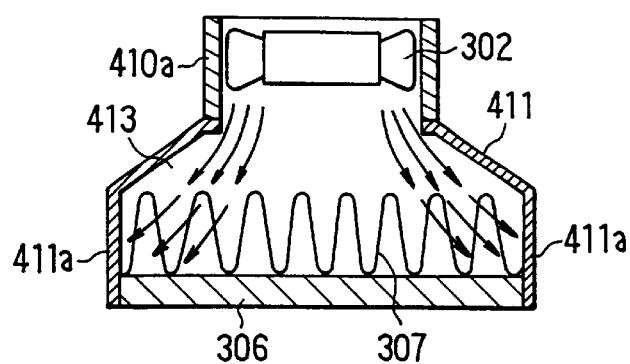
FIG. 41 is a cross-sectional view taken along line IXL—IXL in FIG. 39.

As shown in FIGS. 40 and 41, the support casing 411 has a generally truncated pyramid shape with a bottom, which opens and faces the corrugated fin 307 at a side opposite to the radiation plate 306. An air passage 413 is provided in the support casing 411 between the installation surface 411b and the corrugated fin 307. An area of the air passage 413 is increases as it approaches the corrugated fin 307.

Next, operation of the present embodiment is explained. When the blower 302 is operated, cooling air flows from the blower 302 into the air passage 413 through the opening portion 411d as indicated by arrows in FIG. 41. Because the area of the air passage 413 is increased as it approaches the corrugated fin 307, cooling air smoothly flows along the shape of the air passage 413 and changes from an axial flow to a slope flow. According to the present embodiment, because the air passage 413 is defined by the support casing 411, the cylindrical shroud portion 410a can be adopted. The shape of the blower case 410 is simple. Further, the shape of the support casing 411 defining the air passage 413 therein is a generally truncated pyramid, which is also simple. Consequently, the cooling device has a simple structure as a whole, resulting in easy manufacture.

Figure 42:
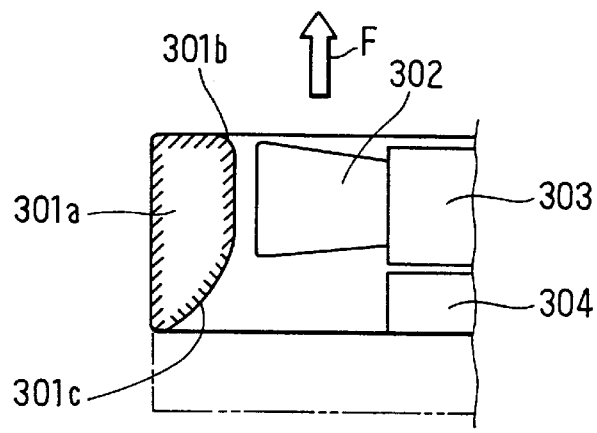
FIG. 42 is a cross-sectional view showing a shroud portion in a modified embodiment of the sixth and seventh embodiments.

In the sixth and seventh embodiments described above, the blower 302 is a so-called forced type fan, which blows out cooling air toward the corrugated fin 307 and the radiation plate 306; however, it may be a suction type fan as shown in FIG. 42 as a modified example. In FIG. 42, cooling air is sucked into the blower 302 after flowing along the surface of the radiation plate 306, inside the corrugated fin 307, and along the bell-mouth shaped edge portion 301c of the shroud portion 301a. The shape of the support casing 411 is not limited to the truncated pyramid as in the seventh embodiment, but is changeable, provided that the area of the air passage is increased or decreased along cooling air flow.

According to the sixth and seventh embodiments, because the air passage in which cooling air from the blower flows has an area, which increases or decreases along cooling air flow, cooling air is smoothly guided. Therefore, the axial flow produced by the blower can be changed into a slope flow along the radiation plate 306 even when the cooling device is used under a large pressure loss. As a result, sufficient cooling performance can be exhibited without using large sized blower and motor.

(Eighth Embodiment)

Figure 43:
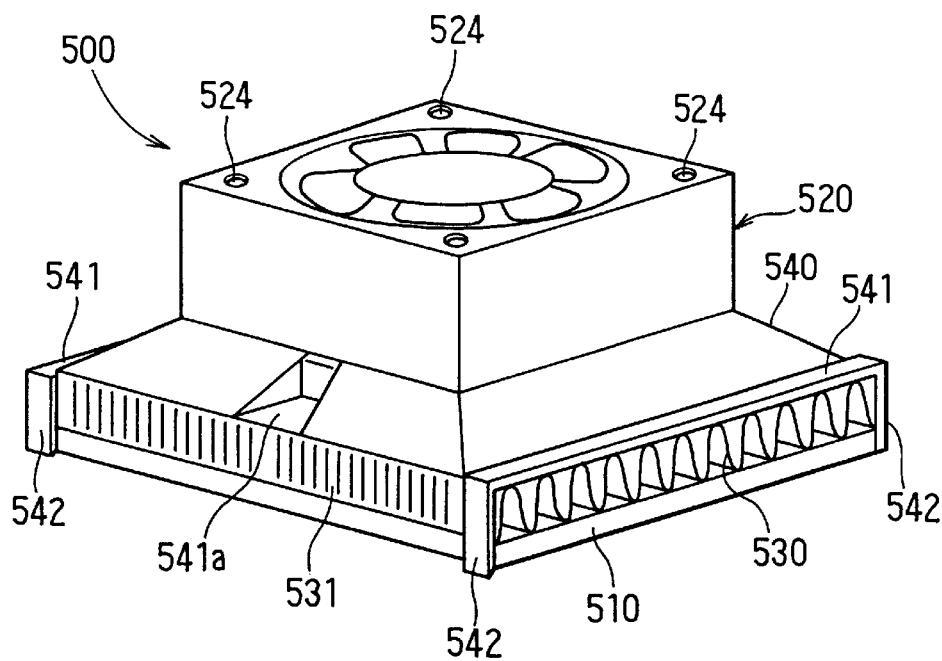
FIG. 43 is a perspective view showing a cooling device in an eighth preferred embodiment.
Figure 44:
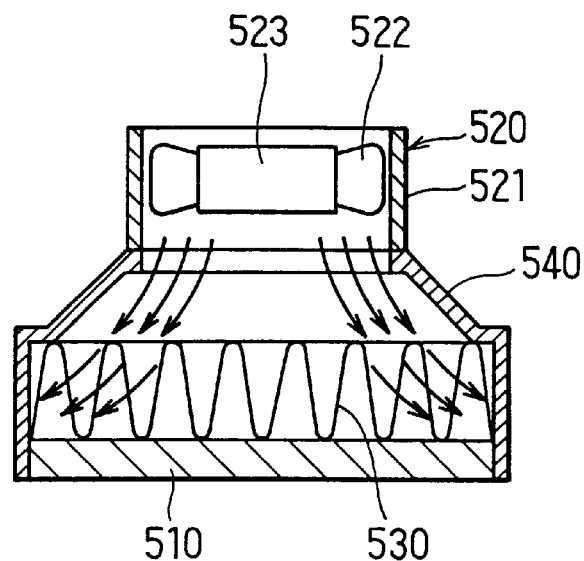
FIG. 44 is a cross-sectional view showing the cooling device in FIG. 43 along an axial direction of a motor.

In an eighth preferred embodiment, the present invention is applied to a cooling device 500 shown in FIG. 43 for cooling a microprocessor (MPC) as a heat generating member. In FIG. 43, reference numeral 510 denotes a square radiation plate made of non-ferrous metal such as aluminum. The MPU (not shown) is thermally joined to generally the center of the radiation plate 510 at an opposite side of a cooling fin described below. Reference numeral 520 denotes an axial box fan (blower) that blows out cooling air toward the plate 510 in a direction approximately perpendicular to the surface of the plate 510. The box fan 520 has, as shown in FIG. 44, an axial fan 522 and a small motor 523 for driving the axial fan 522. The axial fan 522 and the motor 523 are accommodated in a rectangular parallelopiped box 521.

A corrugated cooling fin 530 formed from an aluminum thin plate by roller forming is disposed between the fan 520 and the plate 510 to thereby facilitate thermal radiation from the plate 510. The fin 530 is, as shown in FIG. 43, formed with plural louvers 531 for changing a direction of air flow. Trough portions of the fin 530 are disposed on the side of the plate 510, so that portions between the trough portions and crest portions of the fin 530 (where the louvers 531 are formed) extend from the plate 510 toward the fan 520.

An aluminum support casing 540 is disposed between the fin 530 and the fan 520 to support the fan 520 and to define therein a passage in which air blown out from the fan 520 flows. As shown in FIG. 44, the support casing 540 is tapered so that a passage area in cross section is continuously increased from the fan 120 toward the fin 530. The support casing 140 has two flat portions 541 extending in a direction generally parallel to the plate 510 and perpendicular to a ridge direction of ridge portions of the fin 530. Each of the ridge portions extends along a top of each of the crest portions. The direction perpendicular to the ridge direction is referred to as a corrugated direction. Each of the flat portions 541 has pillar members 542 at both longitudinal ends thereof, and the pillar members 542 extend from the flat portions 541 to the support casing 540 to fix the support casing 540 to the plate 510. The flat portions 541 are joined to the fin ridge portions at both ends in the ridge direction of the fin 530. The tapered portion of the support casing further has a flat portion 541a between the flat portions 541.

Figure 45:
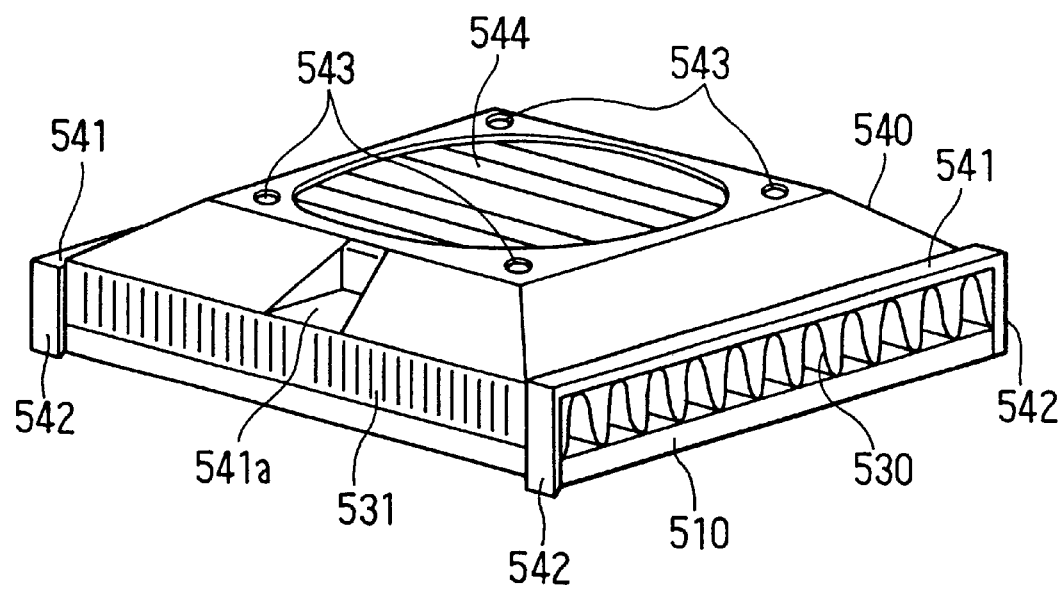
FIG. 45 is a perspective view showing the cooling device from which a fan is detached in the eighth embodiment.

The fan 520 is fixed to the support casing 540 by screws 524 penetrating the box 521 to reach the support casing 540. As shown in FIG. 45, the support casing 540 has female screw portions 543 screwed with the screws 524, and an opening portion 344 for introducing blowout air therein. The device from which the fan 520 is detached (composed of only the plate 510, the fin 530, and the support casing 540) is referred to as a cooling unit in the present embodiment.

Next, a method of manufacturing the cooling unit is described. The support casing 540 is formed from an aluminum plate, at least a surface (clad surface) of which is cladded (covered) with brazing filler metal, by press forming so that the clad surface is positioned at the fin side. The plate 510 is also formed to have at least a clad surface cladded with brazing filler metal at the fin side. Then, the fin 530 is disposed on the clad surface of the plate 510.

Figure 46:
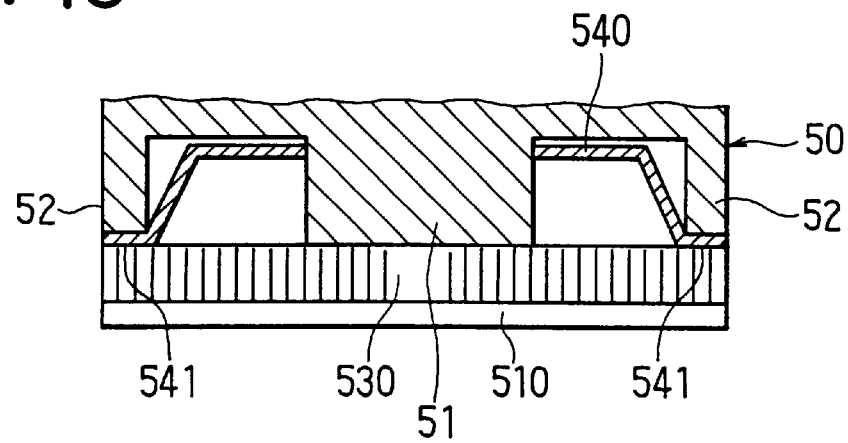
FIG. 46 is an explanatory view showing a state where a support casing, a fin, and a plate are provisionally fixed to each other in the eighth embodiment.

As shown in FIG. 46, the support casing 540, the plate 510 and the fin 530 are provisionally assembled to one another by a jig 50. The jig 50 is composed of a first pushing portion 51 for pushing the fin 530 while positioning the support casing 540 by penetrating the opening portion 544, and second pushing portions 52 for pushing the flat portions 541. The provisionally assembled cooling unit is then heated within a vacuum furnace, so that the plate 510, the fin 530 and the support casing 540 are integrally brazed to one another.

Next, features of the eighth embodiment are explained. According to the eighth embodiment, the fin 530 is brazed to the support casing 540 in contact with the flat portions 541 of the support casing 540. Therefore, the contact area between the support casing 540 and the fin 530 is large. As a result, a sufficient joining strength between the support casing 540 and the fin 530 is secured while decreasing a number of manufacturing steps of the cooling device 500 by integrally brazing the plate 510, the fin 530, and the support casing 540. Also, because the support casing 540 has the pillar members 542 extending from the flat portions 541 to the plate 510 for fixing the support casing 540 to the plate 510, the support casing 540 can be tightly joined to the plate 510 and the fin 530.

Generally, because a corrugated fin is formed by regularly bending a thin plate by roller forming, the corrugated fin is liable to be deformed in a direction perpendicular both the ridge direction and the corrugated direction. However, according to the present embodiment, the flat portions 541 extend in the direction (corrugated direction) perpendicular to the ridge direction of the fin 530, and thereby prevent the deformation of the fin 530. The flat portions 541 (support casing 540), the fin 530, and the plate 510 can be securely brazed to one another.

The fin 530 is pushed by the first pushing portion 51 and the second pushing portions 52 of the jig 50 through the flat portions 541 when provisionally fixed. That is, at that time, the fin 530 is pushed at three portions in the ridge direction thereof. Therefore, the fin 530 can be securely pushed against the plate 510, resulting in tight bonding between the fin 530 and the plate 510 by brazing. Because the jig 50 pushes the flat portions 541 of the support casing 540 by the second pushing portions 52 thereof, the support casing 540 is securely provisionally fixed to the fin 530 and the plate 110. As a result, the support casing 540, the fin 530, and the plate 510 are tightly brazed to one another.

Figure 47:
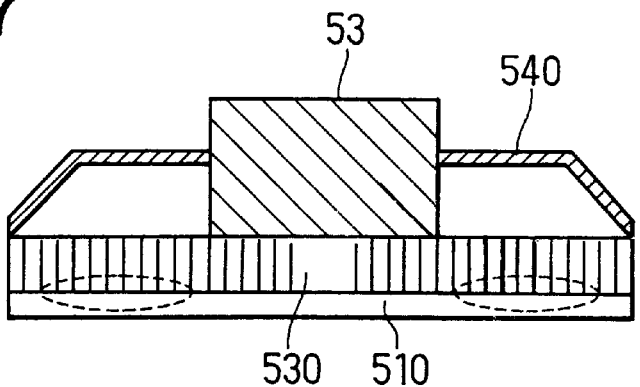
FIG. 47 is an explanatory view showing a comparative example in which the support casing, the fin, and the plate are provisionally fixed to each other.

Incidentally, when the support casing 540 does not have the flat portions 541, as shown in FIG. 47, only the central portion of the fin 530 is pushed by a jig 53 penetrating the opening portions 544 of the support casing 540. This may cause brazing failures between the fin 530 and the plate 510.

Figure 48:
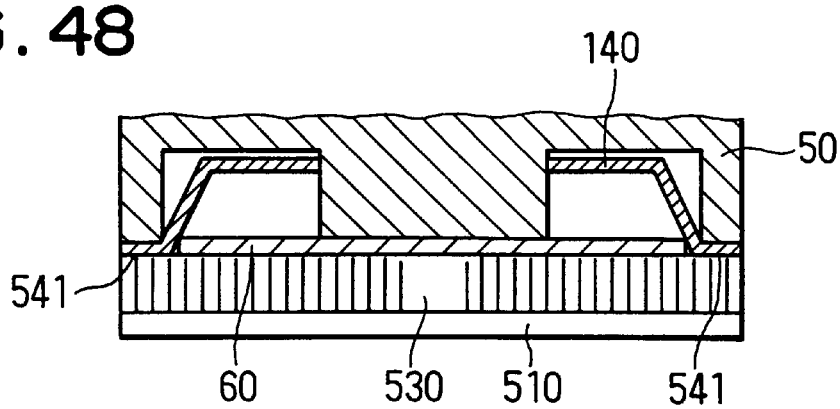
FIG. 48 is an explanatory view showing a state where the support casing, the fin, and the plate are provisionally fixed to each other as a modified example of the eighth embodiment.

As shown in FIG. 48, a jig plate 60 may be disposed under the first pushing portion 51 of the jig 50 so that the fin 530 is pushed entirely in the ridge direction of the fin 530. Accordingly, the fin 530 can be more securely provisionally fixed to the plate 510, thereby providing the fin 530 more securely brazed to the plate 510. The plate 510 is not limited to a rectangular as in the embodiment described above, but may have another shape such as a circle. The heat generating member is not limited to the electronic part, but may be another heat generating member.

(Ninth Embodiment)

Figure 49:
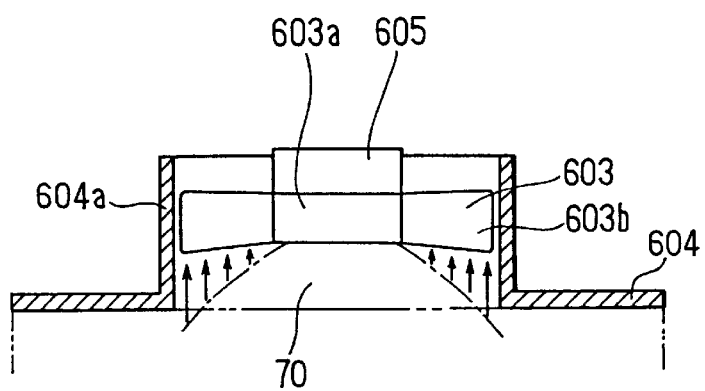
FIG. 49 is a cross-sectional view showing a speed distribution of air flow produced by a suction type blower in a ninth preferred embodiment.

A seventh preferred embodiment is explained with reference to FIGS. 49 to 51. FIG. 49 shows a structure adopting a suction type blower 603. The blower 603 has a cylindrical boss part 603a at a center thereof, and several blades disposed around the boss part 3a at an equal interval and forming a fan 603b. The blower 603 is a small type having a diameter in a range of approximately 3 to 8 mm. A motor 605 is attached to the back face (on an upper side in FIG. 49) of the boss part 603a. The motor 605 is a D.C. brushless motor with output in a range of approximately 1 to 3 W. A blower case 604 covers the blower 603 so that a cylindrical part 604a thereof faces the fan 603b to guide cooling air as a shroud. Because the blower 603 is disposed inside the cylindrical part 604a, a sufficient space 70 is provided under the boss part 603a of the blower 603.

Figure 50:
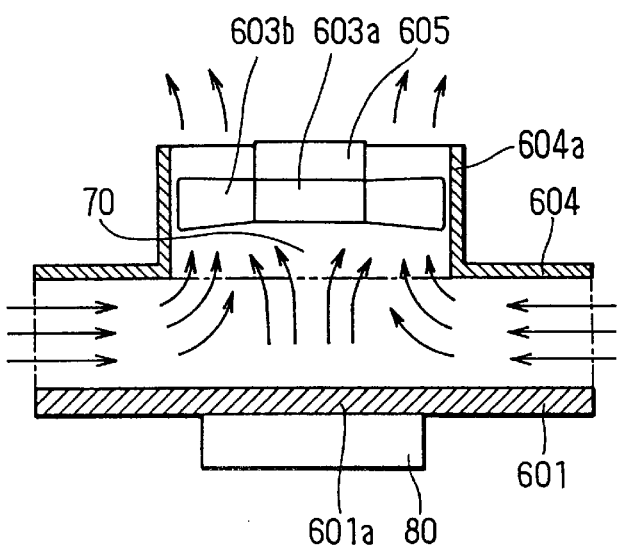
FIG. 50 is a cross-sectional view showing the blower in FIG. 49, assembled with a radiation plate in the ninth embodiment.

FIG. 50 shows the blower 603 and the blower case 604, which are assembled with a radiation plate 601. The radiation plate 601 is formed from an aluminum plate having a thickness in a range of approximately 1 to 5 mm, and is disposed to closely contact a heat generating member 80. The blower 603 produces cooling air due to rotation of the fan 603b. A circumferential speed of the fan is increased as progressing outwardly in a radial direction of the fan, and accordingly, cooling air produced by the blower 603 has an air flow speed, which becomes large as progressing outwardly in the radial direction as shown in FIG. 49.

As a result, the space 70 under the boss part 603a of the blower 603 has a negative pressure, so that cooling air flows even into the space 70 under the boss part 603a as shown in FIG. 50. A height of the space 70 is approximately 2 to 10 mm, and more preferably 2 to 5 mm in the present embodiment. That is, as shown in FIG. 50, cooling air is not only sucked into an outer circumferential portion of the blower 603 but also introduced to a radiation plate central portion 601a. Cooling air flows widely above the radiation plate 601, thereby performing effective thermal radiation.

Figure 51:
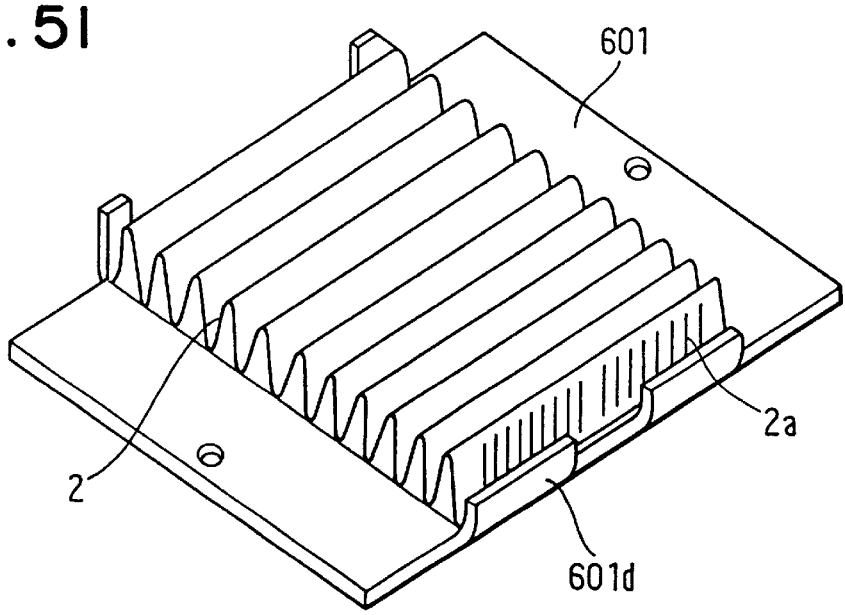
FIG. 51 is a perspective view showing the radiation plate and a corrugated fin attached to the radiation plate in the ninth embodiment.

As shown in FIG. 51, a corrugated fin 2 is attached to the radiation plate 601. The corrugated fin 2 is formed form an aluminum bar member of approximately 0.1 mm in thickness, and brazed to the radiation plate 601 made of aluminum alloy. The corrugated fin 2 has plural louvers 2a formed by cutting and bending to allow cooling air to pass through inside thereof.

The blower case 604 is attached to the upper surface of the corrugated fin 2, i.e., at the opposite side of the radiation plate 601 with respect to the corrugated fin 2. Because the blower 603 is a suction type as described above, cooling air can flow toward the central portion 601a of the radiation plate 601, even when the corrugated fin 2 is disposed between the blower case 604 and the radiation plate 601. Because the louvers 2a are provided on the corrugated fin 2, cooling air smoothly flows among the louvers 2a to be sucked into the blower 603.

As shown in FIG. 51, engagement portions 601d integrally formed with the radiation plate 601 by bending covers the corrugated fin 2 and improves brazing performance by positioning the corrugated fin 2. The blower case 604 is made of resin such as saturated polyester or ABS resin, and fixed to the radiation plate 601 by screws or the like not shown. According to the present embodiment, because the suction type blower 603 is adopted so that air is sucked into the blower after flowing along the radiation plate and because a large space is provided at the radiation plate side of the blower, cooing air for cooling the radiation plate can be introduced to the central portion, which is under the boss part of the blower. As a result, the radiation plate can be entirely effectively cooled.

(Tenth Embodiment)

Figure 52A:
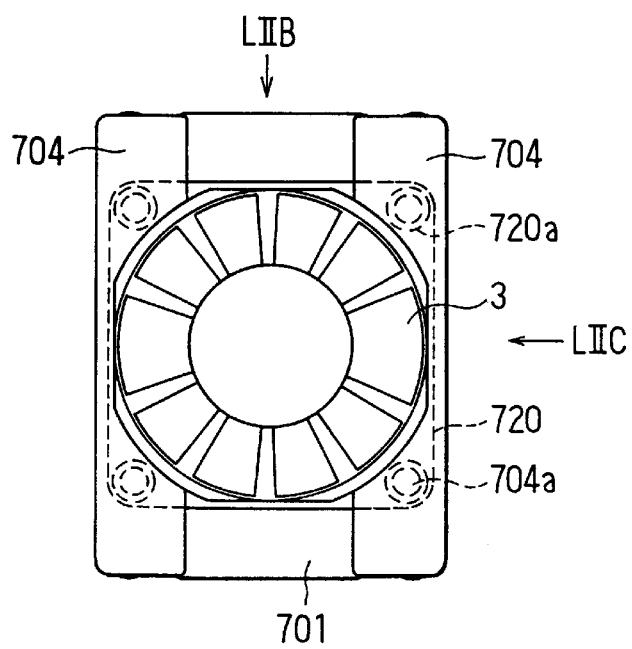
FIG. 52A is a front view showing a cooling device in a tenth preferred embodiment.
Figure 52B:
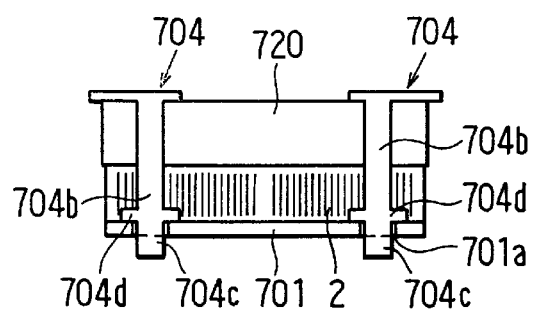
FIG. 52B is a side view showing the cooling device taken in a direction indicated by arrow LIIB in FIG. 52A.
Figure 52C:
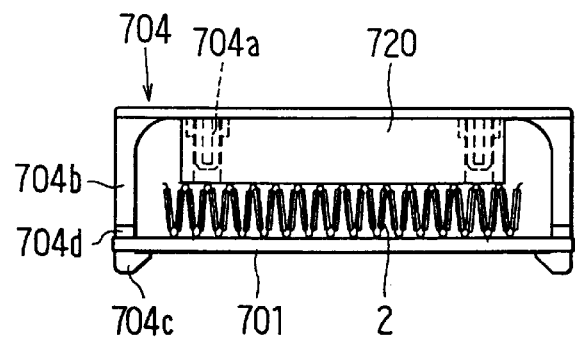
FIG. 52C is a side view showing the cooling device taken in a direction indicated by arrow LIIC in FIG. 52A.

A tenth preferred embodiment is a modification of the third embodiment. Referring to FIGS. 52A to 52C, a cooling device in the tenth embodiment is composed of a radiation plate 701, a corrugated fin 2, a blower 3, a blower case 720, and a pair of resin supports 704 formed separately from the radiation plate 701 and the blower case 720. As shown in FIGS. 53A to 53C, each of the resin supports 704 has blower case connecting members 704a, and radiation plate connecting members 704b integrated with each other. The blower case 720 has connection holes 720a, and the resin supports 704 are fixed to the blower case 720 by inserting the connecting members 704a into the connection holes 720a.

Each of the radiation plate connecting members 704b has a hook portion 704c at a front end thereof for hooking on the radiation plate 701, and a flange portion 704c for keeping a gap with the blower case connecting members 704a, in which the corrugated fin 2 brazed to the radiation plate 701 and the blower case 720 are accommodated. The radiation plate 701 has groove portions 701a, and the hook portions 704c of the resin supports 704 are hooked on the groove portions 701a using resin elasticity thereof. Accordingly, the blower case 720 is fixed to the radiation plate 701 via the resin supports 704. Because the resin supports 704 have the flange portions 704c, the height of the cooling device is not affected by manufacture variation in size of the corrugated fin 2.

Figure 55:
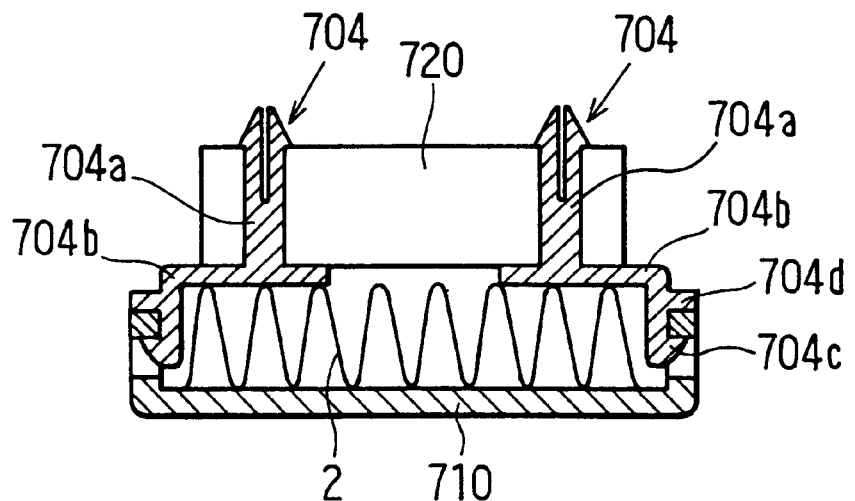
FIGS. 55 to 58 are cross-sectional views showing other modifications of the tenth embodiment.
Figure 56:
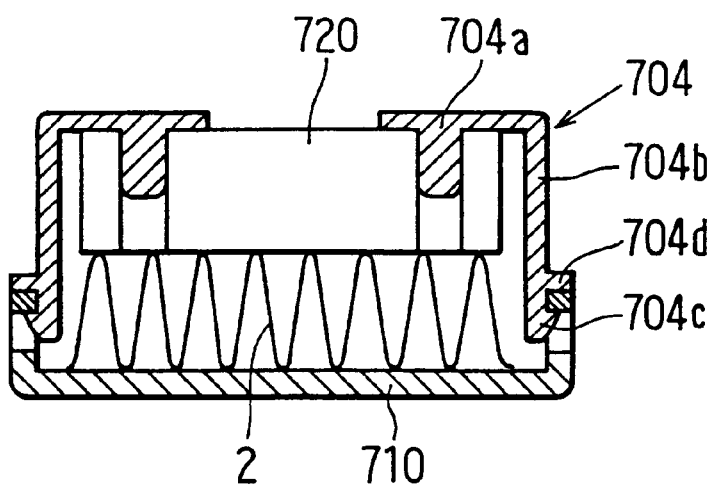
Figure 57:
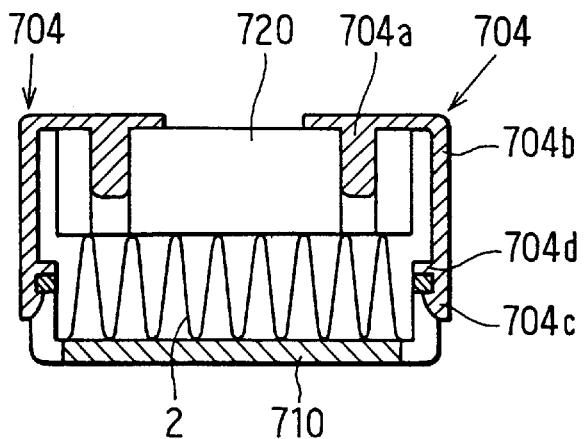
Figure 58:
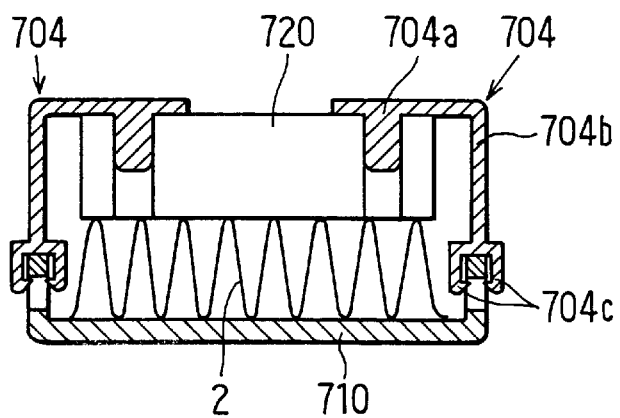

FIGS. 54 to 58 shows modifications of the tenth embodiment. As shown in FIGS. 55 to 58, a radiation plate 710 may have perpendicularly extending portions with holes so that the radiation plate connecting members 704b of the resin supports 704 are engaged with the holes at the corrugated fin side. Accordingly, the radiation plate 710 can closely contact the heat generating member to radiate heat therefrom. As shown in FIGS. 54 and 55, each of the blower case connecting members 704a of the resin supports 704 may have a fork end engagement portion at a front end thereof and be inserted into the connection holes of the blower case 720 from the side of the corrugated fin 2.

Figure 59:
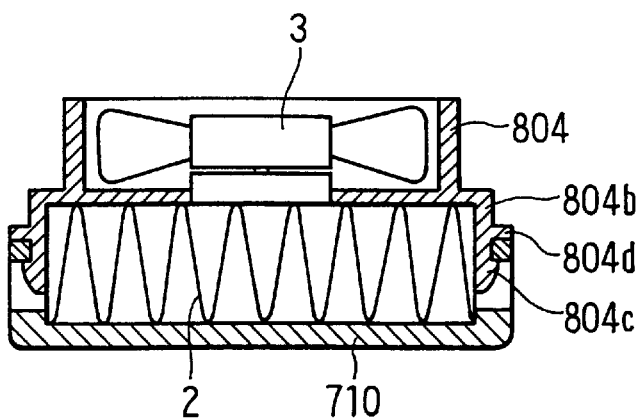
FIG. 59 is a cross-sectional view showing a combination of the first embodiment and the tenth embodiment.

It is apparent that the first to tenth embodiments can be combined with each other properly. For example, the blower case 301 in the sixth embodiment may have the leg portions 6 as in the first embodiment. The first embodiment and the tenth embodiment may be combined as shown in FIG. 59, in which a blower case 804 integrally has radiation plate connecting members 804b as leg portions. The radiation plate connecting members 804b have hook portions 804c for hooking on the radiation plate 1 and flange portions 804d. Further, although the support casing 411 has the leg portions 411a in the seventh embodiment, not the support casing 411 but the radiation plate 306 may have leg portions as in the fourth embodiment.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A cooling device for radiating heat from a heat generating member, comprising:

a radiation plate for contacting the heat generating member;

a corrugated fin disposed on the radiation plate and having a plurality of louvers;

a blower disposed to face the corrugated fin at a side opposite to the radiation plate, for producing cooling air that flows along the radiation plate;

a blower case covering the blower to guide the cooling air; and first and second support members connected to the radiation plate and facing the corrugated fin at both sides in a corrugated direction of the corrugated fin, wherein:

the corrugated fin is covered with a member at a side of the blower, except a portion facing the blower;

each of the first and second support members faces only a part of a side face of the corrugated fin in the corrugated direction to allow the cooling air to flow out in the corrugated direction.

2. The cooling device of claim 1, wherein the first and second support members are fixed to the radiation plate by an elastic force thereof.

3. The cooling device of claim 1, wherein the first and second support members are integrally formed with the blower case.

4. The cooling device of claim 1, wherein the first and second support members are separate from the radiation plate and the blower case.

5. The cooling device of claim 1, wherein the radiation plate has first and second installation holes for receiving the first and second support members.

6. The cooling device of claim 1, wherein:

the radiation plate has an installation surface for contacting the heat generating member, and first and second engagement portions engaged with the first and second support members at a side of the corrugated fin with respect to the installation surface.

7. The cooling device of claim 1, wherein the blower case is made of fire retarding resin.

8. The cooling device of claim 1, wherein the first and second support members has a shape in cross-section approximately parallel to a surface of the radiation plate, the shape having a contour along a flow of cooling air from the blower.

9. The cooling device of claim 1, wherein the radiation plate and the corrugated fin are made of aluminum alloy and are brazed to each other.

10. The cooling device of claim 1, wherein:

an air passage is provided between the blower and the corrugated fin, in which cool air flows in an air flow direction; and an air flow area of the air passage gradually changes in the air flow direction.

11. The cooling device of claim 10, wherein:

the blower case has a cylindrical shroud portion for covering the blower and defining the air passage therein;

the shroud portion has a thickness in a radial direction thereof, which gradually changes in the air flow direction.

12. The cooling device of claim 10, further comprising a support casing holding the corrugated fin and the radiation plate and connected to the blower case, wherein:

the air passage is provided in the support casing.

13. The cooling device of claim 1, wherein the blower is a suction type for sucking the cooling air.

14. The cooling device of claim 13, further comprising a motor for driving the blower, the motor being disposed at the central portion of the blower at a side opposite to the radiation plate.

15. The cooling device of claim 1, wherein the louvers are angled in a radially outward direction on the corrugated fin.

16. The cooling device of claim 1, wherein the first and second support members prevent deformation of the corrugated fin.

17. The cooling device of claim 1, further comprising a support casing holding the corrugated fin therein and supporting the blower, the support casing having a flat portion to which the corrugated fin is joined, the flat portion extending in parallel to the radiation plate.

18. The cooling device of claim 17, wherein the corrugated fin is joined to the flat portion at an end in a direction perpendicular to a corrugated direction thereof.

19. The cooling device of claim 17, wherein the flat portion extends in a corrugated direction of the corrugated fin.

20. The cooling device of claim 17, wherein the first and second support members are integrated with the support casing to connect the blower case and the radiation plate.

21. The cooling device of claim 17, wherein the radiation plate, the support casing, and the corrugated fin are brazed to one another.

22. The cooling device of claim 1, wherein the member is a part of the blower case.

23. The cooling device of claim 1, wherein the corrugated fin has a thickness smaller than that of the radiation plate.

24. The cooling device of claim 1, wherein the corrugated fin is a member separate from the radiation plate.

25. The cooling device of claim 1, wherein each of the first and second support members directly face the side face of the corrugated fin.

26. The cooling device of claim 1, wherein the side face of the corrugated fin is exposed except a portion facing a corresponding one of the first and second support members so that the cooling air can flow out in the corrugated direction.

27. A cooling device for radiating heat from a heat generating member, the cooling device comprising:

a radiation plate for contacting the heat generating member;

a fin joined to the radiation plate for facilitating thermal radiation of the radiation plate; and a blower disposed to face the fin at an opposite side of the radiation plate, for producing cooling air, wherein an air passage is provided between the blower and the fin for guiding the cooling air produced by the blower, with an air passage area, which gradually changes in an air flow direction in which the cooling air flows.

28. The cooling device of claim 27, further comprising a blower case having a cylindrical shroud portion for covering the blower there in, the shroud portion defining the air passage.

29. The cooling device of claim 28, wherein the shroud portion has a bell-mouth shape in cross-section so that the air passage area changes in the air flow direction.

30. The cooling device of claim 27, further comprising:

a blower case holding the blower therein; and a support casing connected to the blower case and holding the fin and the radiation plate therein, the support casing defining the air passage therein.

31. The cooling device of claim 30, wherein the support casing has a truncated pyramid shape.

32. The cooling device of claim 27, further comprising:

a support casing disposed between the fin and the blower and having a flat portion extending in parallel to the radiation plate and joined to the fin, the support casing defining the air passage therein.

33. The cooling device of claim 32, wherein:

the fin is a corrugated fin having a plurality of crest portions;

the flat portion of the support casing extends in a corrugated direction of the corrugated fin and are joined to the plurality of crest portions at an end of the corrugated fin in a direction perpendicular to the corrugated direction.

34. The cooling device of claim 27, wherein the cooling air is sucked into the blower after flowing along the radiation plate.

35. The cooling device of claim 27, wherein the fin is a corrugated fin having a plurality of louvers.

36. A cooling device for radiating heat from a heat generating member, comprising:

a radiation plate for contacting the heat generating member;

a corrugated fin disposed on the radiation plate;

a blower disposed to face the corrugated fin at a side opposite to the radiation plate, for producing cooling air that flows along the radiation plate;

a blower case covering the blower to guide the cooling air; and first and second support members connected to the radiation plate and facing the corrugated fin at both sides in a corrugated direction of the corrugated fin; wherein:

the corrugated fin has a plurality of louvers for allowing cooling air to pass therethrough;

the support members face first and second portions of the corrugated fin at the both sides in the corrugated direction; and the louvers are provided on the corrugated fin other than the first and second portions.

37. A cooling device for radiating heat from a heat generating member, comprising:

a radiation plate for contacting the heat generating member;

a corrugated fin disposed on the radiation plate;

a blower disposed to face the corrugated fin at a side opposite to the radiation plate, for producing cooling air that flows along the radiation plate;

a blower case covering the blower to guide the cooling air; and first and second support members connected to the radiation plate and facing the corrugated fin at both sides in a corrugated direction of the corrugated fin; wherein:

the first and second support members are integrally formed with the radiation plate by bending and are connected to the blower case.

38. The cooling device of claim 37, wherein:

the first and second support members protrude from the radiation plate at the both sides in the corrugated direction of the corrugated fin; and the blower case has first and second installation holes for fixedly receiving the first and second support members.

39. The cooling device of claim 37, wherein the corrugated fin abuts one of the radiation plate and the first and second support members at the both sides in the corrugated direction thereof.

40. The cooling device of claim 39, wherein the radiation plate has leg portions for being fixed to the heat generating member.

41. The cooling device of claim 40, wherein the leg portion is elastically deformable for being fixed to the heat generating member while pushing the radiation plate against the heat generating member.

42. A cooling device for radiating heat from a heat generating member, comprising:

a radiation plate for contacting the heat generating member;

a corrugated fin disposed on the radiation plate;

a blower disposed to face the corrugated fin at a side opposite to the radiation plate, for producing cooling air that flows along the radiation plate;

a blower case covering the blower to guide the cooling air;

first and second support members connected to the radiation plate and facing the corrugated fin at both sides in a corrugated direction of the corrugated fin; wherein:

the blower is a suction type for sucking the cooling air; and the blower and the corrugated fin define therebetween a gap in a range of approximately 2 to 5 mm.

43. A cooling device for radiating heat from a heat generating member, comprising:

a radiation plate for contacting the heat generating member;

a corrugated fin disposed on the radiation plate;

a blower disposed to face the corrugated fin at a side opposite to the radiation plate, for producing cooling air that flows along the radiation plate;

a blower case covering the blower to guide the cooling air; and first and second support members connected to the radiation plate and facing the corrugated fin at both sides in a corrugated direction of the corrugated fin; wherein:

each of the first and second support members has a blower case connecting member connected to the blower case and a radiation plate connecting member connected to the radiation plate; and the radiation plate connecting member has an engagement portion at a front end thereof to be fixedly engaged with the radiation plate and a flange portion for abutting the radiation plate at a side of the corrugated fin.

44. A cooling device for radiating heat from a heat generating member, the cooling device comprising:

a radiation plate for contacting the heat generating member to receive the heat;

a blower for producing cooling air which flows along the radiation plate;

a blower case holding the blower therein and connected to the radiation plate; and a corrugated fin joined to the radiation plate between the radiation plate and the blower, and having a plurality of louvers; wherein:

the cooling air is sucked into the blower after flowing along the radiation plate; and the blower and the corrugated fin define a space therebetween, the space having a height in a direction perpendicular to the radiation plate, the height being in a range of approximately 2 to 5 mm.

45. A cooling device for radiating heat from a heat generating member, comprising:

a radiation plate for contacting the heat generating member;

a corrugated fin disposed on the radiation plate;

a blower disposed to face the corrugated fin at a side opposite to the radiation plate, for producing cooling air that flows along the radiation plate;

a blower case covering the blower to guide the cooling air; and first and second support members connected to the radiation plate and facing the corrugated fin at both sides in a corrugated direction of the corrugated fin;

wherein the first and second support members are integrally formed with the blower case and allows the cooling air to flow out in the corrugated direction of the corrugated fin.

46. A cooling device for radiating heat from a heat generating member, comprising:

a radiation plate for contacting the heat generating member;

a corrugated fin disposed on the radiation plate;

a blower disposed to face the corrugated fin at a side opposite to the radiation plate, for producing cooling air that flows along the radiation plate;

a blower case covering the blower and the entire corrugated fin to guide the cooling air; and first and second support members connected to the radiation plate and facing only a portion of the corrugated fin at both sides in a corrugated direction of the corrugated fin.

* * * * *